(12) United States Patent
Ueda et al.

(10) Patent No.: US 10,160,597 B2
(45) Date of Patent: Dec. 25, 2018

(54) ARTICLE STORAGE FACILITY

(71) Applicant: Daifuku Co., Ltd., Osaka-shi (JP)

(72) Inventors: Toshihito Ueda, Shiga (JP); Hiroshi Otsuka, Shiga (JP); Takeshi Abe, Shiga (JP)

(73) Assignee: Daifuku Co., Ltd., Osaka-shi (JP)

( * ) Notice: Subject to any disclaimer, the term of this patent is extended or adjusted under 35 U.S.C. 154(b) by 325 days.

(21) Appl. No.: 14/987,958

(22) Filed: Jan. 5, 2016

(65) Prior Publication Data
US 2016/0332815 A1 Nov. 17, 2016

(30) Foreign Application Priority Data

Jan. 6, 2015 (JP) ................................ 2015-001000

(51) Int. Cl.
*B65G 1/04* (2006.01)
*B65G 1/137* (2006.01)
*H01L 21/673* (2006.01)
*H01L 21/677* (2006.01)

(52) U.S. Cl.
CPC ........... *B65G 1/137* (2013.01); *B65G 1/0435* (2013.01); *H01L 21/67389* (2013.01); *H01L 21/67769* (2013.01); *B65G 2207/40* (2013.01)

(58) Field of Classification Search
CPC .. B65G 1/0407; B65G 1/0428; H01L 21/6773
See application file for complete search history.

(56) References Cited

U.S. PATENT DOCUMENTS

2015/0098775 A1* 4/2015 Razumov ............. B65G 1/0407
414/282

FOREIGN PATENT DOCUMENTS

| JP | 2003267518 A | 9/2003 |
| JP | 2009007124 A | 1/2009 |

\* cited by examiner

*Primary Examiner* — Saul Rodriguez
*Assistant Examiner* — Willie Berry, Jr.
(74) *Attorney, Agent, or Firm* — The Webb Law Firm

(57) ABSTRACT

A plurality of transport controls selectively performed by a transport control device include a second transport control performed on a selected one of a first article transport device and a second article transport device as a target article transport device such that the target article transport device is moved only in a first path portion to transport articles when the target article transport device is the first article transport device, and that the target article transport device is moved only in a second path portion to transport the articles when the target article transport device is the second article transport device. An article storage facility includes a partition body that is switchable between an installed state in which the partition body is installed in a path boundary area serving as a boundary area between the first path portion and the second path portion in a movement path to shut off communication between the first path portion and the second path portion, and a retracted state in which the partition body is retracted from the path boundary area to open the path boundary area.

10 Claims, 9 Drawing Sheets

Fig.11

| | first partition sensor | second partition sensor | first door sensor | second door sensor | first interior space | second interior space |
|---|---|---|---|---|---|---|
| first transport control | detecting state | non-detecting state | detecting state | detecting state | power feeding | power feeding |
| second transport control (first stacker crane is selected) | detecting state | non-detecting state | detecting state | non-detecting state | power feeding | interruption |
| second transport control (second stacker crane is selected) | detecting state | non-detecting state | non-detecting state | detecting state | interruption | power feeding |
| third transport control | non-detecting state | detecting state | detecting state | detecting state | power feeding | power feeding |

# ARTICLE STORAGE FACILITY

CROSS-REFERENCE TO RELATED APPLICATION

This application claims priority to Japanese Patent Application No. 2015-001000 filed Jan. 6, 2015, the disclosure of which is hereby incorporated in its entirety by reference.

FIELD OF THE INVENTION

The present invention relates to an article storage facility including an article storage rack including a plurality of storage sections that store articles, an article transport device that moves in front of the article storage rack, along the lateral width direction of the rack to transport the articles, and a transport control device that controls the operation of the article transport device.

BACKGROUND

An example of the above-described article storage facility is described in JP 2009-007124A. The article storage facility of JP 2009-007124A is configured such that the article transport device moves in front of the article storage rack, along the lateral width direction of the rack, and articles are transported by the article transport device.

In the case of installing two article transport devices, namely, a first article transport device and a second article transport device, as the article transport devices in such an article storage facility, it is conceivable that a movement path (referred to as "first path portion") in which the first article transport device moves and a movement path (referred to as "second path portion") in which the second article transport device moves are provided so as to be arranged side by side in proximity to each other or continuously in the lateral width direction of the rack. By providing the first path portion and the second path portion so as to be arranged side by side in the lateral width direction of the rack in this way, the article storage facility can be easily installed in a smaller floor surface area than when the first path portion and the second path portion are provided so as to be separated in the lateral width direction of the rack or the front-rear direction of the rack.

In the case of an article storage facility including a single article transport device, it is desirable that a transport control device that controls the article transport device selectively performs a full path transport control in which the article transport device moves in the entire movement path, and a partial path transport control in which the article transport device moves in a part of the movement path to transport articles. That is, there is a need for a configuration in which the full path transport control is performed to transport articles by the article transport device during a normal operation, and, when the operator needs to enter the movement path to perform an operation due to a maintenance operation or the like on the article storage rack, the partial path transport control is performed to allow the operator to enter the movement path and to perform the maintenance operation, while moving the article transport device in the remaining portion (referred to as "transport operation path portion") of the movement path excluding the path portion (referred to as "maintenance path portion") in which the operator has entered, thereby continuing transporting the articles.

SUMMARY OF THE INVENTION

When the article transport device is moved in the part of the movement path excluding the path portion in which the operator has entered to continue transporting the articles, the operator may come into contact with the moving article transport device.

Specifically, in the case where two article transport devices, namely, the first article transport device and the second article transport device, are installed as the article transport devices, if the operator has stepped out from the first path portion into the second path portion, for example, when performing a maintenance operation on the first article transport device or the article storage rack in the first path portion, then the operator may come into contact with the second article transport device that is moving in the second path portion.

In the case where the transport control device that controls the article transport device selectively performs the full path transport control and the partial path transport control, if the operator has stepped out from the maintenance path portion into the transport operation path portion, for example, when preforming a maintenance operation on the article storage rack in the maintenance path portion, then the operator may come into contact with the article transport device that is moving in the transport operation path portion.

Therefore, there is a need for an article storage facility that can prevent, even if the operator has entered a part of the movement path, the operator who has entered the movement path from coming into contact with the article transport device, while continuing transportation of articles by the article transport device in the remaining portion of the movement path.

In view of the foregoing, a first characteristic feature of the article storage facility lies in an article storage facility including: an article storage rack including a plurality of storage sections that store articles; a plurality of article transport devices that move in front of the article storage rack, along a lateral width direction of the rack to transport the articles; and a transport control device that controls operation of the plurality of article transport devices, wherein a movement path in which the plurality of article transport devices move includes a first path portion and a second path portion that are arranged side by side in the lateral width direction of the rack, the plurality of article transport devices include a first article transport device and a second article transport device, a plurality of transport controls selectively performed by the transport control device include a first transport control and a second transport control, the first transport control is a transport control in which the first article transport device is moved only in the first path portion to transport the articles and the second article transport device is moved only in the second path portion to transport the articles, the second transport control is a transport control performed on a selected one of the first article transport device and the second article transport device as a target article transport device such that the target article transport device is moved only in the first path portion to transport the articles when the target article transport device is the first article transport device, and that the target article transport device is moved only in the second path portion to transport the articles when the target article transport device is the second article transport device, and a partition body is provided that is switchable between an installed state in which the partition body is installed in a path boundary area serving as a boundary area between the first path portion and the second path portion in the movement path to shut off communication between the first path portion and the second path portion, and a retracted state in which the partition body is retracted from the path boundary area to open the path boundary area.

According to the first characteristic feature, by the transport control device performing the first transport control, the first article transport device moves in the first path portion to transport articles, and the second article transport device moves in the second path portion to transport articles. Thus, it is possible to perform both the transport of articles by moving the first article transport device in the first path portion, and the transport of articles by moving the second article transport device in the second path portion.

When the operator performs a maintenance operation on one of the first article transport device and the second article transport device, the transport control device performs the second transport control for the article transport device on which the maintenance operation is not performed as the selected article transport device (target article transport device), thereby making it possible to allow the operator to perform the maintenance operation on the article transport device in one of the first movement path and the second movement path, while transporting articles by moving the target article transport device in the other of the second movement path and the first movement path.

For example, when the operator who is performing a maintenance operation on the first article transport device in the first path portion has stepped out into the second path portion, the operator may come into contact with the second article transport device that is moving in the second path portion.

Therefore, the partition body that is switchable between the installed state and the retracted state is provided, and the partition body is installed in the installed state. Thereby, when the operator is about to enter the second path portion, the operator comes into contact with the partition body in the installed state, thus making it possible to physically prevent the operator from entering the second path portion. Further, it is possible to prevent the operator from entering the second path portion by enabling the operator to confirm the presence of the partition body in the installed state and be aware of his or her own location. As a result, it is possible to prevent the operator from coming into contact with the article transport device that is moving.

Thus, even if the operator has entered a part of the movement path, it is possible to continue transporting articles by the article transport device in the remaining part of the movement path, while preventing the operator who has entered the movement path from coming into contact with the article transport device.

In view of the foregoing, a second characteristic feature of the article storage facility lies in an article storage facility including: an article storage rack including a plurality of storage sections that store articles; an article transport device that moves in front of the article storage rack, along a lateral width direction of the rack to transport the articles; and a transport control device that controls operation of the article transport device, wherein a movement path in which the article transport device moves includes a first path portion and a second path portion that are arranged side by side in the lateral width direction of the rack, a plurality of transport controls selectively performed by the transport control device include a full path transport control and a partial path transport control, the full path transport control is a transport control in which the article transport device is moved in both the first path portion and the second path portion to transport the articles, the partial path transport control is a transport control in which the article transport device is moved in one of the first path portion and the second path portion to transport the articles, a partition body is provided that is switchable between an installed state in which the partition body is installed in a path boundary area serving as a boundary area between the first path portion and the second path portion in the movement path to shut off communication between the first path portion and the second path portion, and a retracted state in which the partition body is retracted from the path boundary area to open the path boundary area.

With this configuration, the article transport device moves in both the first path portion and the second path portion to transport articles by the transport control device performing the full path transport control.

For example, when the operator performs a maintenance operation on the article storage rack or the like in the first path portion, it is possible to move the article transport device only in the second path portion, in which the operator is not performing the maintenance operation, to transport articles by the transport control device performing the partial path transport control. Thus, it is possible to allow the operator to perform a maintenance operation on the article storage rack or the like in one of the first movement path and the second movement path, while moving the article transport device in the other of the second movement path and the first movement path to transport articles.

For example, when the operator who is performing a maintenance operation on the article storage rack or the like in the first path portion has stepped out into the second path portion, the operator may come into contact with the article transport device that is moving in the second path portion.

Therefore, by providing the partition body that is switchable between the installed state and the retracted state and installing the partition body in the installed state, the operator comes into contact with the partition body in the installed state when the operator is about to enter the second path portion, thus making it possible to physically prevent the operator from entering the second path portion. Furthermore, it is possible to prevent the operator from entering the second path portion by enabling the operator to confirm the presence of the partition body in the installed state and be aware of his or her location. As a result, it is possible to prevent the operator from coming into contact with the article transport device that is moving.

Thus, even if the operator has entered a part of the movement path, it is possible to continue transporting articles by the article transport device in the remaining portion of the movement path, while preventing the operator who has entered the movement path from coming into contact with the article transport device.

BRIEF DESCRIPTION OF THE DRAWINGS

FIG. 11 is a table showing a relationship between the detecting states of sensors and the power feeding by a feeding device.

DETAILED DESCRIPTION

Hereinafter, an embodiment of an article storage facility will be described with reference to the drawings.

Figure 1:
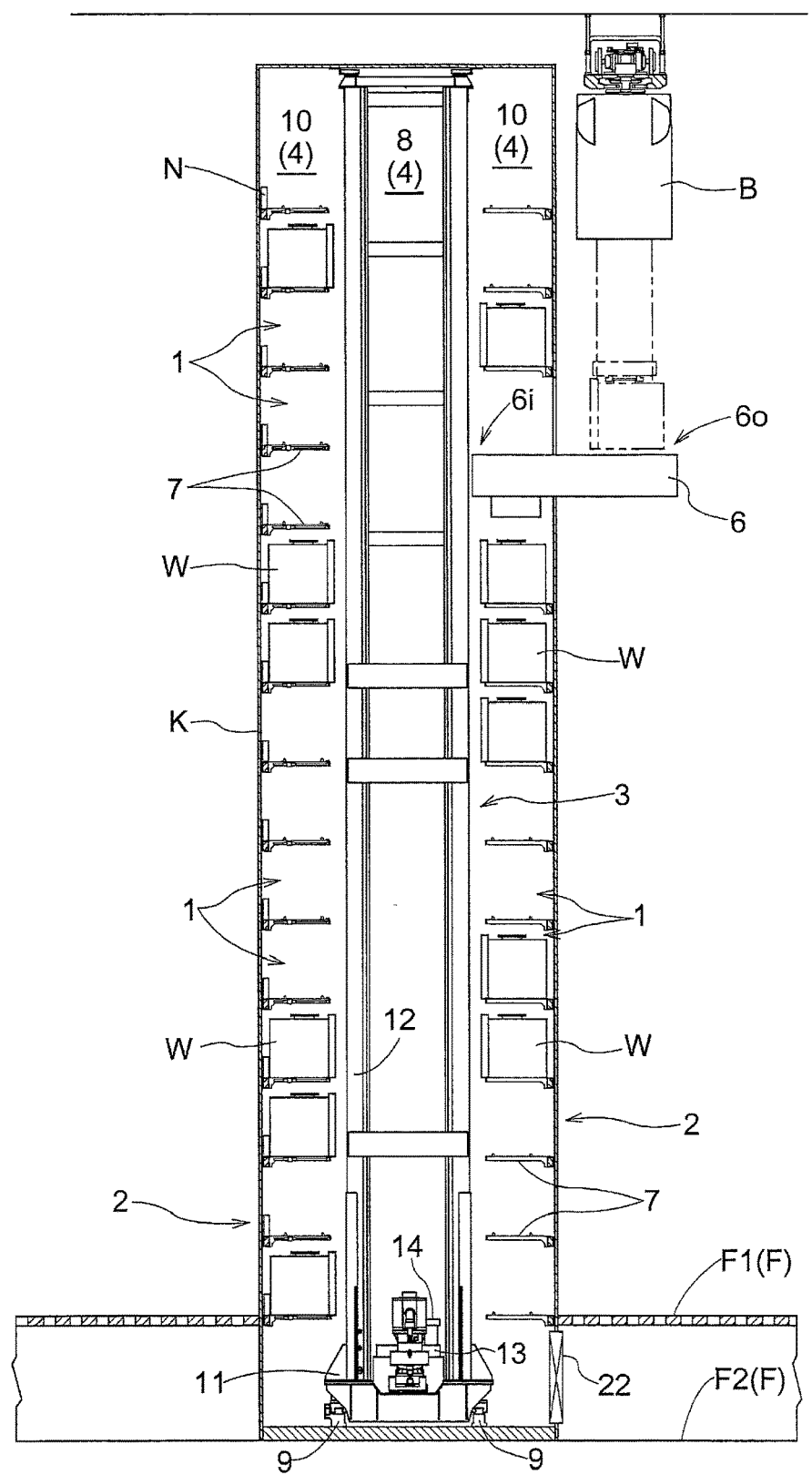
FIG. 1 is a front view of an article storage facility according to an embodiment.
Figure 2:
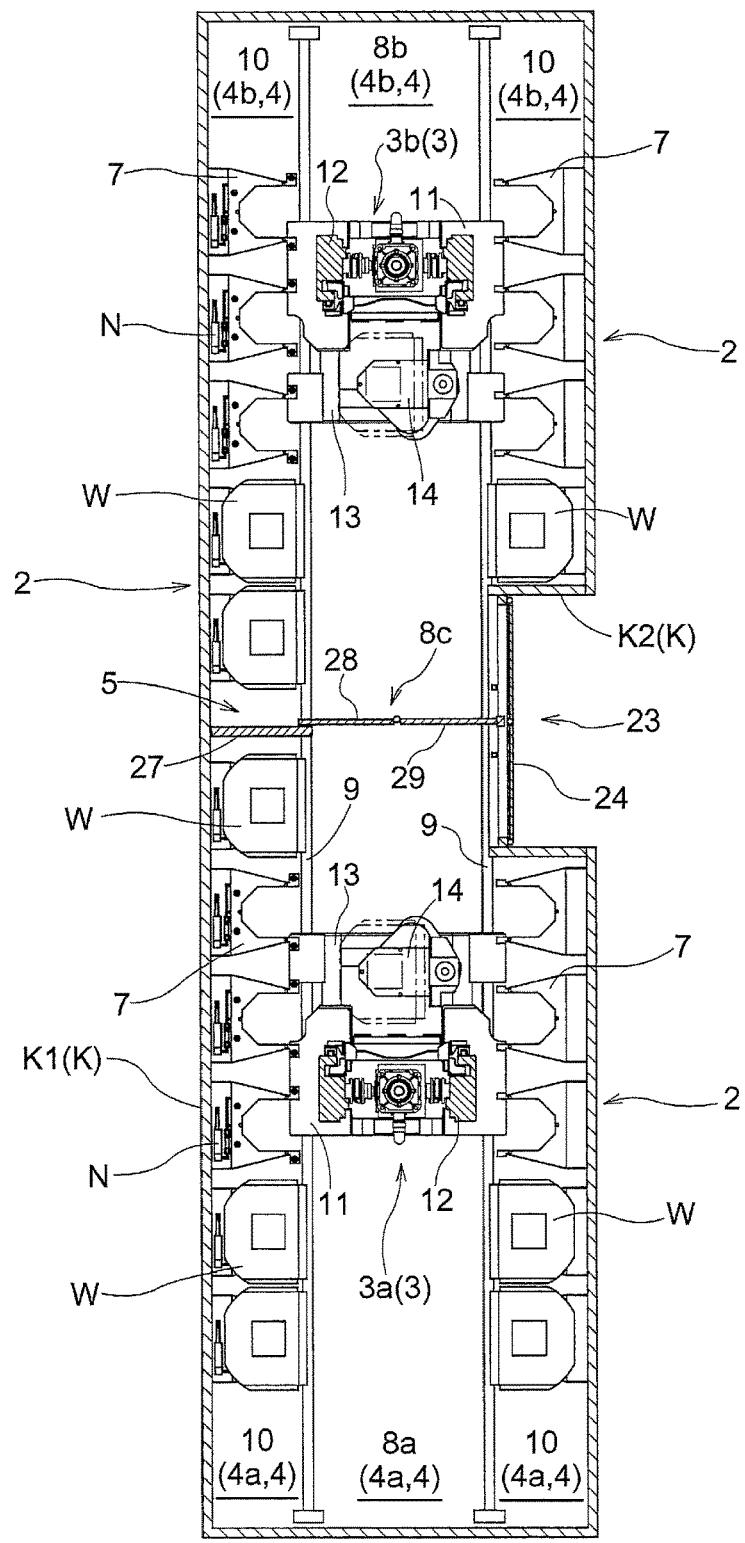
FIG. 2 is a plan view of the article storage facility according to an embodiment.

As shown in FIGS. 1 and 2, an article storage facility is provided with an article storage rack 2, a stacker crane 3, a wall body K, a partition body 5, and a storage and retrieval conveyor 6. The article storage rack 2 includes a plurality of storage sections 1 that store containers W as articles. The stacker crane 3 travels in front of the article storage rack 2, along the lateral width direction of the rack to transport the containers W. The wall body K is installed so as to cover an interior space 4. Here, the interior space 4 is a space including both an installation space 10 in which the article storage rack 2 is installed, and a traveling path 8 in which the stacker crane 3 travels. The partition body 5 is configured to be switchable between an installed state and a retracted state. In the installed state, the partition body 5 partitions the interior space 4 along the lateral width direction of the rack so as to divide the interior space 4 into a first interior space 4a and a second interior space 4b. The storage and retrieval conveyor 6 is provided extending through the wall body K, and transports the containers W thereon.

The article storage facility is installed in a down flow-type clean room in which clean air flows downward from the ceiling side to the floor side. As shown in FIG. 1, a floor portion F of the clean room is configured by a lower floor F2 and an upper floor F1 that is provided above the lower floor F2. An underfloor space is formed between the lower floor F2 and the upper floor F1, and a work space is formed between the upper floor F1 and the ceiling. The upper floor F1 is a grating floor, and has a plurality of ventilation holes extending therethrough in the up-down direction. The lower floor F2 is a floor having no ventilation hole, and is constituted by non-porous concrete in the present embodiment.

As shown in FIG. 2, the interior space 4 includes a first interior space 4a and a second interior space 4b that are arranged side by side in the lateral width direction of the rack, and a pair of article storage racks 2 are provided so as to oppose each other in each of the first interior space 4a and the second interior space 4b. Each of the article storage racks 2 includes a plurality of storage sections 1 arranged side by side in the up-down direction and the lateral width direction of the rack. Also, each of the plurality of storage sections 1 is provided with a placement body 7 that supports thereon a stored container W. One (the article storage rack 2 located on the left side in FIGS. 1 and 2) of the pair of article storage racks 2 is provided with a nitrogen gas supply device N that supplies a nitrogen gas to the containers W stored in the storage sections 1. Note that the nitrogen gas supply device N corresponds to an inactive gas supply device that supplies an inactive gas to the containers W stored in the storage sections 1.

The storage and retrieval conveyor 6 is configured so as to transport the container W thereon between an external transfer area 6o located outside of the wall body K (outside of the interior space 4 covered by the wall body K) and an internal transfer area 6i located inside (the interior space 4) of the wall body K. Although not shown, the storage and retrieval conveyor 6 is provided for each of the first interior space 4a and the second interior space 4b. The storage and retrieval conveyor 6 is provided such that a ceiling guided vehicle B performs loading and unloading of the container W to and from the external transfer area 6o of the storage and retrieval conveyor 6 installed at a high position, and that the operator performs loading and unloading of the container W to and from the external transfer area 6o of the storage and retrieval conveyor 6 (not shown) installed at a low position.

As shown in FIG. 2, the traveling path 8 in which the stacker crane 3 travels has a first path portion 8a and a second path portion 8b that are arranged side by side in the lateral width direction of the rack. A first stacker crane 3a that travels in the first interior space 4a along the lateral width direction of the rack to transport containers W in the first interior space 4a, and a second stacker crane 3b that travels in the second interior space 4b along the lateral width direction of the rack to transport containers W in the second interior space 4b are provided as the stacker crane 3.

Note that the stacker crane 3 corresponds to the article transport device that moves along the lateral width direction of the rack, and the traveling path 8 corresponds to the movement path in which the article transport device moves. Further, the first stacker crane 3a corresponds to the first article transport device that moves in the first path portion 8a to transport articles, and the second stacker crane 3b corresponds to the second article transport device that moves in the second path portion 8b to transport articles.

The traveling path 8 is formed between a pair of opposing article storage racks 2. The first path portion 8a of the traveling path 8 is formed in the first interior space 4a, and the second path portion 8b of the traveling path 8 is formed in the second interior space 4b. The traveling path 8 is segmented into the first path portion 8a and the second path portion 8b along the lateral width direction of the rack, and the first path portion 8a and the second path portion 8b do not overlap.

A traveling rail 9 is installed in the traveling path 8 along the lateral width direction of the rack (the longitudinal direction of the traveling path 8), and the traveling rail 9 is formed continuously from the first path portion 8a to the second path portion 8b.

Each of the first stacker crane 3a and the second stacker crane 3b includes a traveling vehicle 11 that travels on the traveling rail 9 along the lateral width direction of the rack, an elevation platform 13 that moves up and down along a mast 12 provided upright on the traveling vehicle 11, and a transfer device 14 supported by the elevation platform 13. The transfer device 14 transfers the container W between itself and the storage section 1 or the internal transfer area 6i of the storage and retrieval conveyor 6.

When a container W is loaded on the external transfer area 6o of the storage and retrieval conveyor 6 in the article storage facility, the container W is transported on the storage and retrieval conveyor 6 from the external transfer area 6o to the internal transfer area 6i. Then, in the first interior space 4a, the container W is transported from the internal transfer area 6i to a storage section 1 by the first stacker crane 3a. In the second interior space 4b, the container W is transported from the internal transfer area 6i to a storage section 1 by the second stacker crane 3b.

In the first interior space 4a, the container W is transported by the first stacker crane 3a from the storage section 1 to the internal transfer area 6i of the storage and retrieval conveyor 6. In the second interior space 4b, the container W is transported by the second stacker crane 3b from the storage section 1 to the internal transfer area 6i of the storage and retrieval conveyor 6. Then, the container W in the internal transfer area 6i is transported on the storage and retrieval conveyor 6 from the internal transfer area 6i to the external transfer area 6o, and is subsequently unloaded from the external transfer area 6o by the ceiling guided vehicle B or the operator.

Thus, the first stacker crane 3a transports the container W between the internal transfer area 6i and the storage section 1 in the first interior space 4a. The second stacker crane 3b transports the container W between the internal transfer area 6i and the storage section 1 in the second interior space 4b.

Although the detailed description has been omitted, an air inlet for supplying a nitrogen gas discharged from an exhaust nozzle of the nitrogen gas supply device N into the container W and an air outlet for discharging the gas inside the container W are provided in the bottom surface of the container W. Also, the container W is configured to be air-tight by closing, with a cover member, a substrate entrance port for placing a substrate in and out of the container W and closing each of the air inlet and the air outlet with an open/close valve.

When the exhaust nozzle of the nitrogen gas supply device N is connected to the air inlet of the container W and a nitrogen gas is emitted from the exhaust nozzle, the pressure of the emitted nitrogen gas causes the open/close valve of the air inlet to be operated to open, supplying a nitrogen gas into the container W. When the pressure inside the container W is increased by the supply of a nitrogen gas by the nitrogen gas supply device N, the open/close valve of the air outlet is operated to open, discharging the gas inside the container W from the air outlet of the container W.

The present embodiment assumes a FOUP (Front Opening Unified Pod) that accommodates a semiconductor substrate as the container W (article).

As shown in FIGS. 1 and 2, the wall body K is installed so as to cover the interior space 4 including both the installation space 10 in which the article storage rack 2 is installed and the traveling path 8 of the stacker crane 3.

The side periphery of the interior space 4 is surrounded by a non-porous side wall portion K1 of the wall body K. The ceiling of the interior space 4 is closed by a porous ceiling wall portion, and is configured such that clean air flows into the interior space 4 from the ceiling side. Further, a gas discharge portion 22 for discharging the gas in the interior space 4 to the outside of the interior space 4 is provided in a portion of the wall body K that is located below the upper floor F1. Accordingly, clean air flows into the interior space 4 from the ceiling side of the wall body K and the clean air that has flowed in passes downward through the interior space 4 from the ceiling side toward the floor side. Then, the clean air is discharged, together with the nitrogen gas discharged from the container W stored in the storage section 1, from the gas discharge portion 22 to the outside of the interior space 4.

Note that the wall body K surrounds the interior space 4 with the side wall portion K1 when viewed in plan view, and the wall body K (side wall portion K1) corresponds to a surrounding body that surrounds a space including both the installation space 10 in which the article storage rack 2 is installed and the traveling path 8.

Figure 3:
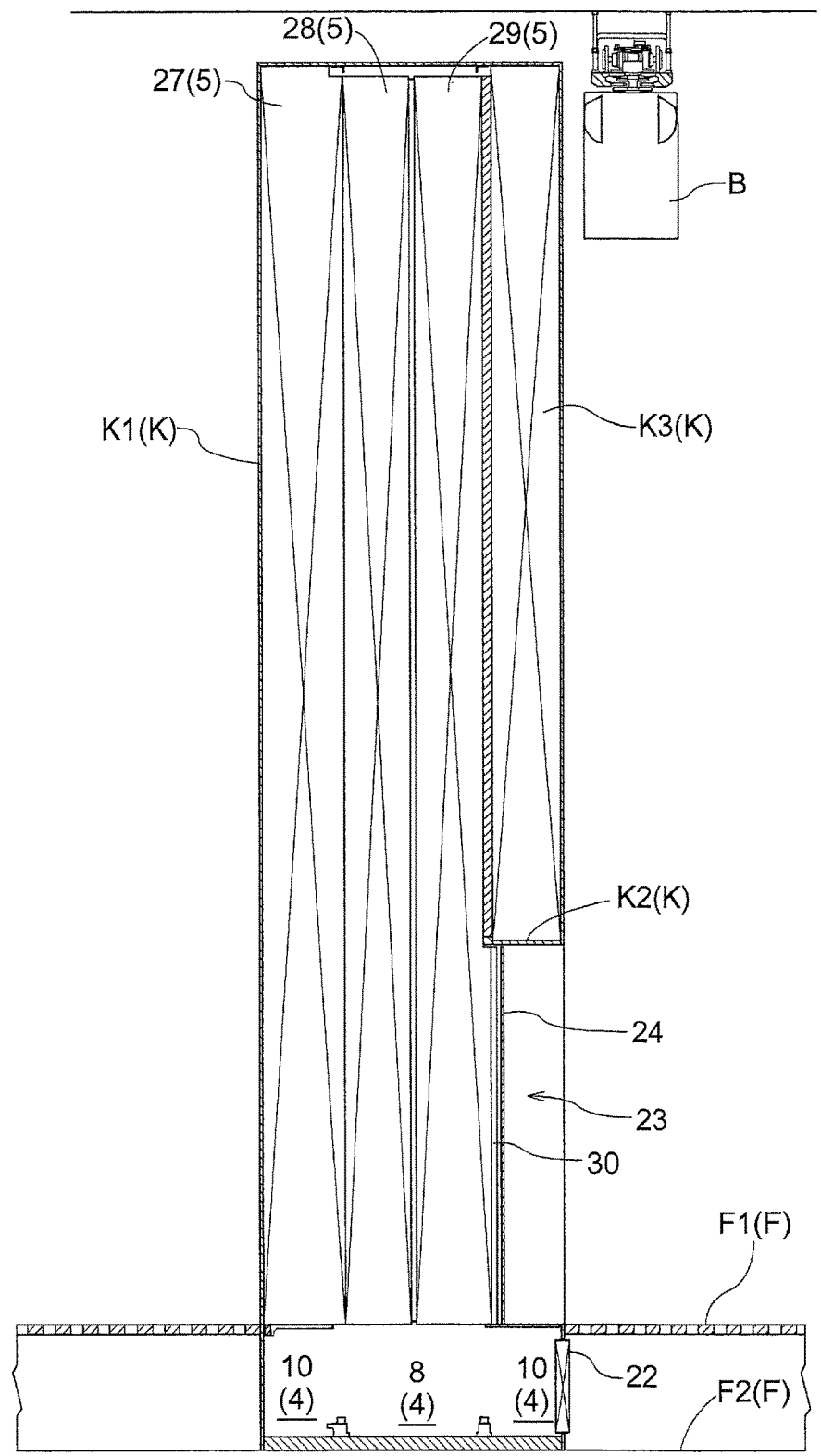
FIG. 3 is a front view showing a partition body of the article storage facility according to an embodiment.
Figure 8:
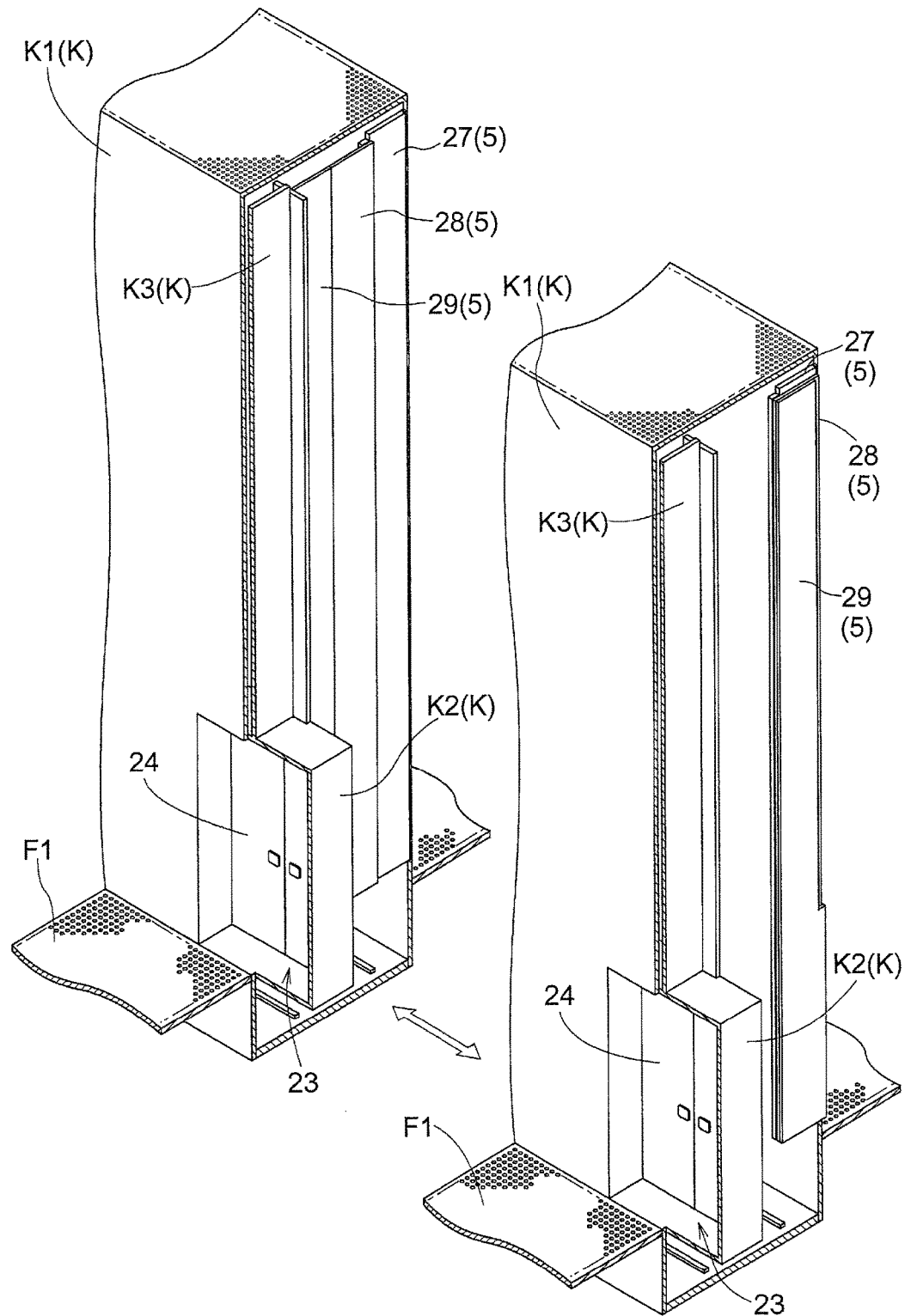
FIG. 8 is a perspective view of relevant portions of the article storage facility, showing an installed state and a retracted state of the partition body.

As shown in FIGS. 2, 3 and 8, the wall body K is provided with an opening 23 from which the operator enters and exits the traveling path 8 and an opening/closing door 24 that closes the opening 23.

The wall body K is provided with a non-porous entrance portion K2 that is formed in a shape surrounding the opening 23. The entrance portion K2 is formed in an angular O-shape when viewed in the front-rear direction of the rack. The opening/closing door 24 is provided at an end of the entrance portion K2 in the front-rear direction of the rack on the side where the traveling path 8 is present. Ends of the entrance portion K2 in the front-rear direction of the rack that are located opposite to the side where the traveling path 8 is present are connected to the side wall portion K1. Also, the entrance portion K2 is provided such that the end of the entrance portion K2 in the front-rear direction of the rack on the side where the traveling path 8 is present does not protrude into the traveling path 8.

The wall body K is also provided with a non-porous shield portion K3 located in a boundary area between the first interior space 4a and the second interior space 4b, directly above the entrance portion K2.

Figure 4:
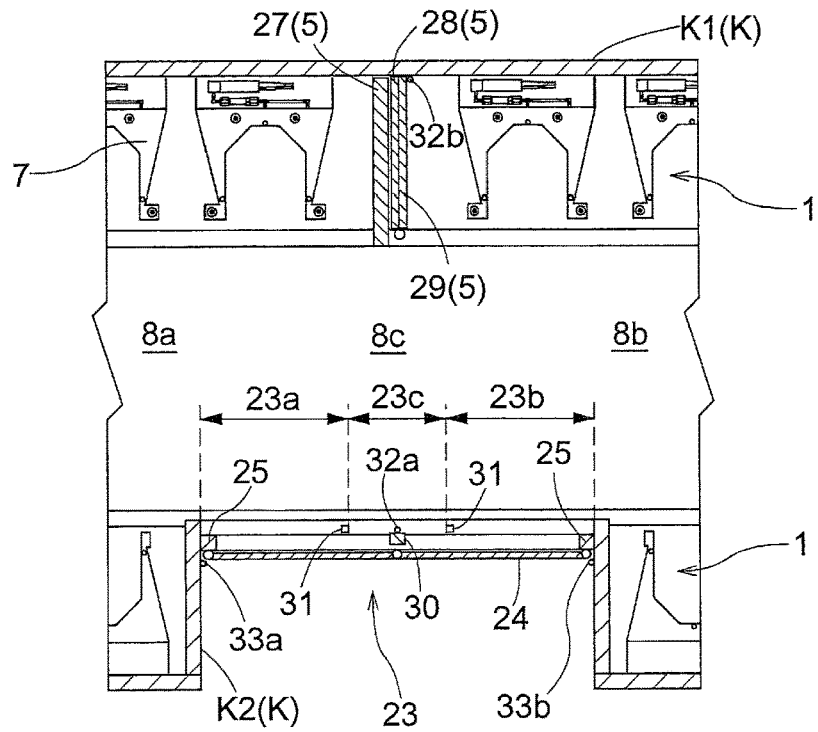
FIG. 4 is a plan view of relevant portions of the article storage facility, showing a closed state of an opening/closing door.
Figure 5:
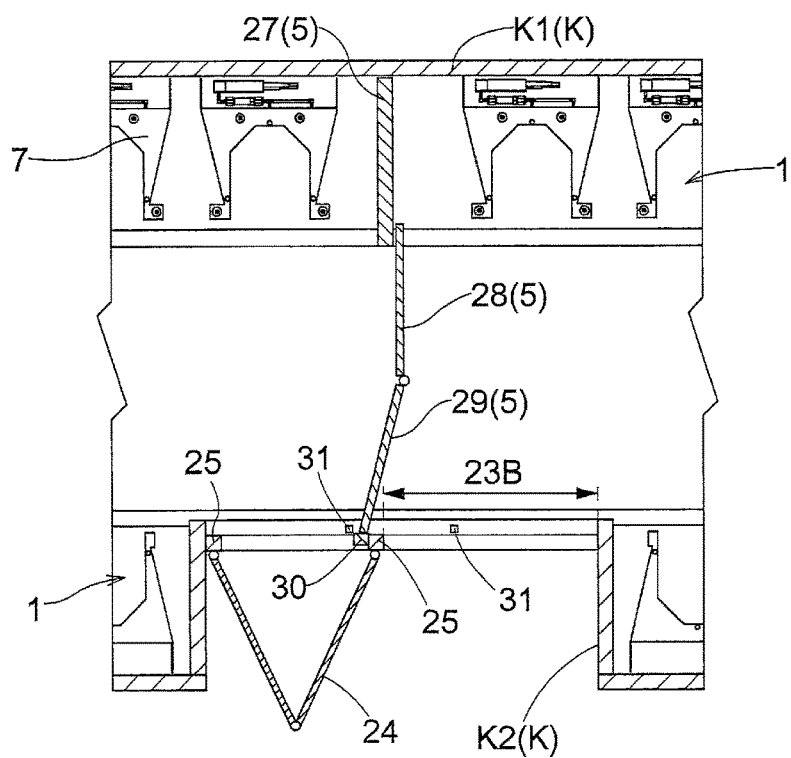
FIG. 5 is a plan view of relevant portions of the article storage facility, showing a second open state of the opening/closing door.
Figure 6:
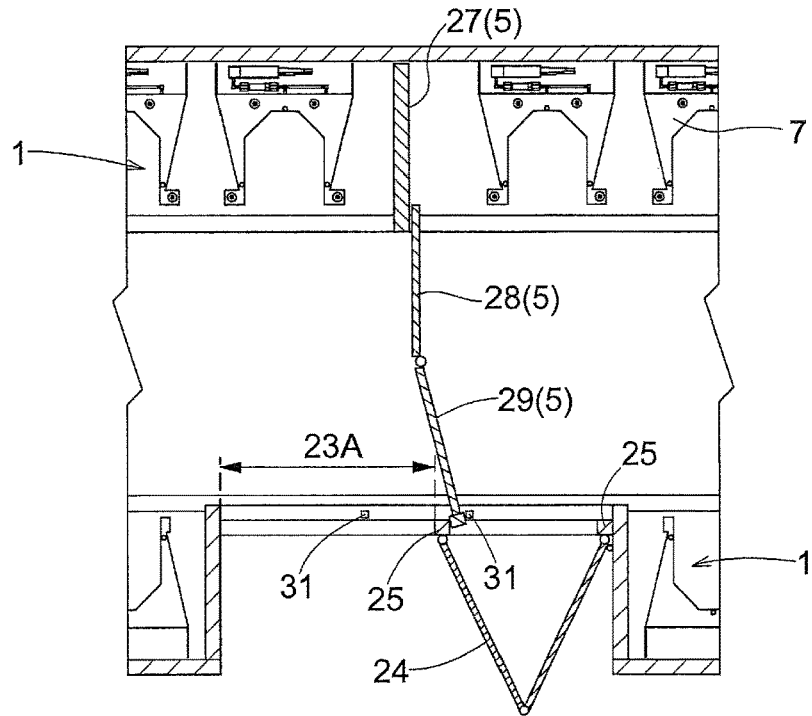
FIG. 6 is a plan view of relevant portions of the article storage facility, showing a first open state of the opening/closing door.

As shown in FIGS. 4 to 6, the opening/closing door 24 is configured such that each of its opposite ends in the lateral width direction of the rack is connected with a door strut member 25 so as to be pivotable about the vertical axis (the axis along the up-down direction), and its central portion in the lateral width direction of the rack is bendable about the vertical axis. The opening/closing door 24 is configured to be switchable between a contracted position (the position shown in FIGS. 5, 6 and 9) in which the central portion of the opening/closing door 24 is bent to bring the opposite ends of the opening/closing door 24 close to each other and an extended position (the position shown in FIGS. 4 and 8) in which the central portion of the opening/closing door 24 is extended to separate the opposite ends of the opening/closing door 24 from each other, by operating the central portion of the opening/closing door 24 to be pushed or pulled in the front-rear direction of the rack. Thus, the opening/closing door 24 is configured to be extendable and contractible in the lateral width direction of the rack so as to be in the contracted position and the extended position by being bent and stretched.

Then, the opening/closing door 24 can close the entire opening 23 by being switched to the extended position (being switched to the closed state), as shown in FIGS. 4 and 8. Also, the opening/closing door 24 can open a first entrance 23A by being switched to the contracted position to be brought closer to the second interior space 4b side in the lateral width direction of the rack (being switched to a first open state), as shown in FIG. 6 and the right side of FIG. 9. Also, the opening/closing door 24 can open a second entrance 23B by being switched to the contracted position to be brought closer to the first interior space 4a side in the lateral width direction of the rack (being switched to a second open state), as shown in FIG. 5 and the left side of FIG. 9. Thus, the opening/closing door 24 is configured to be switchable between the closed state, the first open state, and the second open state.

Next, an additional description will be given of the first entrance 23A and the second entrance 23B.

As shown in FIG. 4, the opening 23 is formed so as to extend across a path boundary area 8c toward both the first interior space 4a and the second interior space 4b in the lateral width direction of the rack. The opening 23 is formed by a first opening portion 23a, a second opening portion 23b, and a third opening portion 23c. Note that the path boundary area 8c is an area serving as the boundary between the first path portion 8a and the second path portion 8b of the traveling path 8, and the first path portion 8a and the second path portion 8b are provided so as to be arranged side by side continuously.

The first opening portion 23a is formed at a position at which its entire opening region overlaps the first interior space 4a when viewed in the front-rear direction of the rack. The second opening portion 23b is formed at a position at which its entire opening region overlaps the second interior space 4b when viewed in the front-rear direction of the rack. The third opening portion 23c is located between the first opening portion 23a and the second opening portion 23b in the lateral width direction of the rack. The third opening portion 23c is formed so as to have an opening region that overlaps the first interior space 4a when viewed in the front-rear direction of the rack and an opening region that overlaps the second interior space 4b when viewed in the front-rear direction of the rack.

Also, the first opening portion 23a and the third opening portion 23c form the first entrance 23A as shown in FIGS. 4 and 6, and the second opening portion 23b and the third opening portion 23c form the second entrance 23B as shown in FIGS. 4 and 5. The third opening portion 23c is shared by the first entrance 23A and the second entrance 23B.

In a state in which the opening/closing door 24 is contracted to be switched to the first open state, only the second opening portion 23b of the opening 23 is closed and the first opening portion 23a and the third opening portion 23c (the first entrance 23A) are opened, as shown in FIG. 6. In a state in which the opening/closing door 24 is contracted to be switched to the second open state, only the first opening portion 23a of the opening 23 is closed and the second opening portion 23b and the third opening portion 23c (the second entrance 23B) are opened, as shown in FIG. 5. Meanwhile, in a state in which the opening/closing door 24 is extended to be switched to the closed state, all of the first opening portion 23a, the second opening portion 23b and the third opening portion 23c of the opening 23 are closed, as shown in FIG. 4.

Accordingly, the opening/closing door 24 has the function as a first door that opens and closes the first entrance 23A and the function as a second door that opens and closes the second entrance 23B, and the wall body K is provided with the first entrance 23A and the second entrance 23B (opening 23), as well as the first door and the second door (opening/closing door 24).

Figure 10:
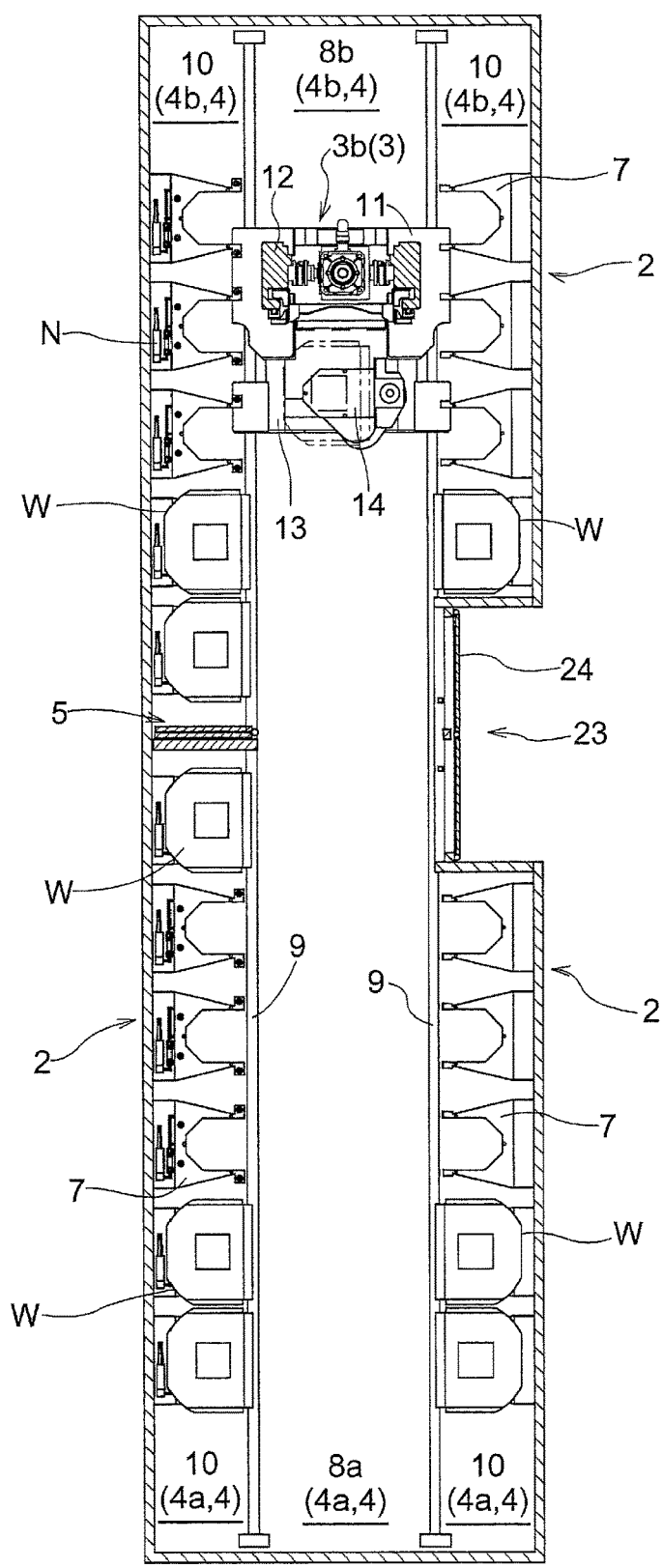
FIG. 10 is a plan view of the article storage facility.

The partition body 5 is configured to be switchable between the installed state and the retracted state. Here, the installed state is a state in which the partition body 5 is located in the boundary area between the first interior space 4a and the second interior space 4b so as to divide the interior space 4 into the first interior space 4a and the second interior space 4b, as shown in FIGS. 2, 3, 5, and 6. The retracted state is a state in which the partition body 5 is retracted at least from the path boundary area 8c of the boundary area between the first interior space 4a and the second interior space 4b so as to provide communication between the first interior space 4a and the second interior space 4b, as shown in FIGS. 4 and 10.

In the installed state, the partition body 5 is installed in the path boundary area 8c of the traveling path 8 so as to shut off communication between the first path portion 8a and the second path portion 8b. In the retracted state, the partition body 5 is retracted from the path boundary area 8c so as to open the path boundary area 8c.

To give an additional description of the partition body 5, the partition body 5 includes a plate-shaped fixed portion 27 fixed to the wall body K, a plate-shaped slide portion 28 capable of slidably moving in the front-rear direction of the rack with respect to the fixed portion 27, a plate-shaped pivot portion 29 that is pivotable about the vertical axis with respect to the slide portion 28, as shown in FIGS. 4 to 6. The fixed portion 27, the slide portion 28 and the pivot portion 29 are formed to be non-porous.

The slide portion 28 slidably moves to a pulled-back position (see FIG. 4) that is pulled back in the installation space 10 and a protruding position (see FIGS. 5 and 6) that is protruded to the traveling path 8 by being slidably moved in the front-rear direction of the rack with respect to the fixed portion 27.

The pivot portion 29 is connected, at its proximal end, with an end of the slide portion 28 on the traveling path 8 side so as to be pivotable about the vertical axis, and pivotably moves to a folded position (see FIG. 4) arranged side by side with the slide portion 28 in the lateral width direction of the rack and an unfolded position (see FIGS. 5 and 6) arranged side by side with the slide portion 28 in the front-rear direction of the rack by being pivoted about the vertical axis. Since the pivot portion 29 is connected with the slide portion 28, the pivot portion 29 slidably moves along the front-rear direction of the rack together with the slide portion 28 as the slide portion 28 slidably moves along the front-rear direction of the rack.

As shown in FIG. 4, the partition body 5 is switched to the retracted state by slidably moving the slide portion 28 to the pulled-back position and pivotably moving the pivot portion 29 to the folded position. As shown in FIGS. 5 and 6, the partition body 5 is switched to the installed state by slidably moving the slide portion 28 to the protruding position and pivotably moving the pivot portion 29 to the unfolded position.

Also, a free end (an end opposite to the proximal end) of the pivot portion 29 is provided with a connecting member for connecting the partition body 5 with a partition body strut member 30 so as to allow the partition body 5 to be retained in the installed state by connecting the free end of the pivot portion 29 with the partition body strut member 30 in a state in which the partition body 5 is switched to the installed state.

Figure 9:
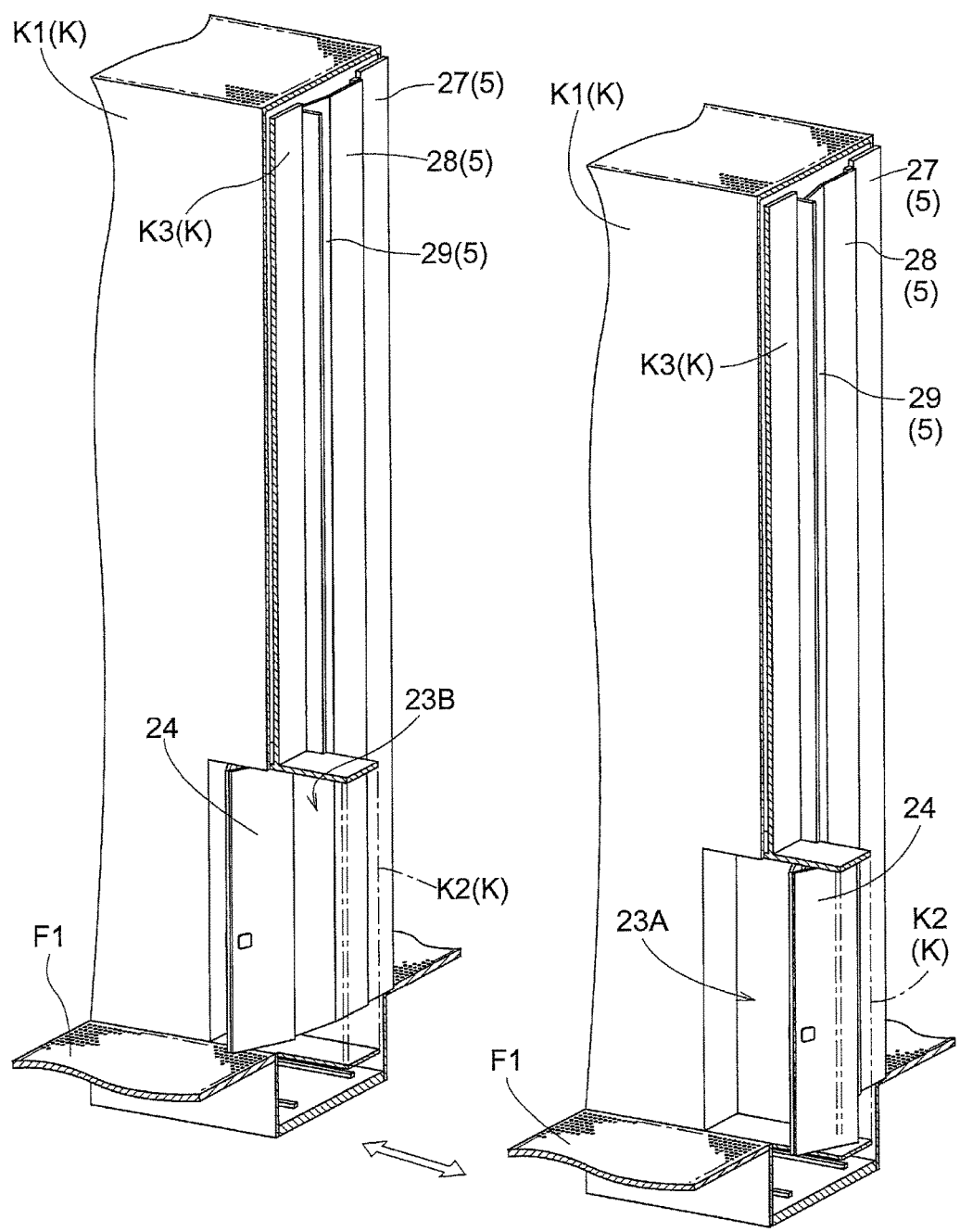
FIG. 9 is a perspective view of relevant portions of the article storage facility, showing the first open state and the second open state of the opening/closing door.

Then, by moving the partition body strut member 30 along the lateral width direction of the rack in a state in which the partition body 5 is connected with the partition body strut member 30 in the above-described manner, the partition body 5 moves to a first partition position or a second partition position while maintaining its installed state, as shown in FIGS. 5, 6 and 9. Here, the first partition position is a position at which the free end (the end of the partition body that is located on the opening 23 side in the front-rear direction of the rack) of the pivot portion 29 is located in a boundary area (opening boundary area) between the second opening portion 23b and the third opening portion 23c of the opening 23, as shown in FIG. 6. The second partition position is a position at which the free end of the pivot portion 29 is located in a boundary area (opening boundary area) between the first opening portion 23a and the third opening portion 23c of the opening 23.

Thus, the partition body 5 is configured to be movable to the first partition position and the second partition position in the installed state, and is located in the path boundary area 8c at each of the first partition position and the second partition position.

The partition body strut member 30 with which the partition body 5 is connected is located between a pair of door strut members 25.

Accordingly, when the opening/closing door 24 is contracted from the closed state to be switched to the first open state, the partition body strut member 30 is operated to be pushed to the second path portion 8b side by one of the pair of door strut members 25 that is located on the first path portion 8a side, and the partition body 5 moves to the first partition position. When the opening/closing door 24 is contracted from the closed state to be switched to the second open state, the partition body strut member 30 is operated to be pushed to the first path portion 8a side by one of the pair of door strut members 25 that is located on the second path portion 8b side, and the partition body 5 moves to the second partition position.

Thus, the partition body 5 and the opening/closing door 24 are configured to be operatively connected with each other such that the partition body 5 moves to the first partition position as the opening/closing door 24 is switched to the first open state, and the partition body 5 moves to the second partition position as the opening/closing door 24 is switched to the second open state. The partition body strut member 30 and the pair of door strut members 25 constitute an operative connection mechanism that operatively connects the partition body 5 with the opening/closing door 24.

In a state in which the opening/closing door 24 is switched to the first open state and the partition body 5 has moved to the first partition position, or a state in which the opening/closing door 24 is switched to the second open state and the partition body 5 has moved to the second partition position, the partition body 5 is retained at the first partition position or the second partition position by the end of the partition body 5 being sandwiched by the door strut member 25 and a retaining strut member 31 that is provided in a fixed condition.

Figure 7:
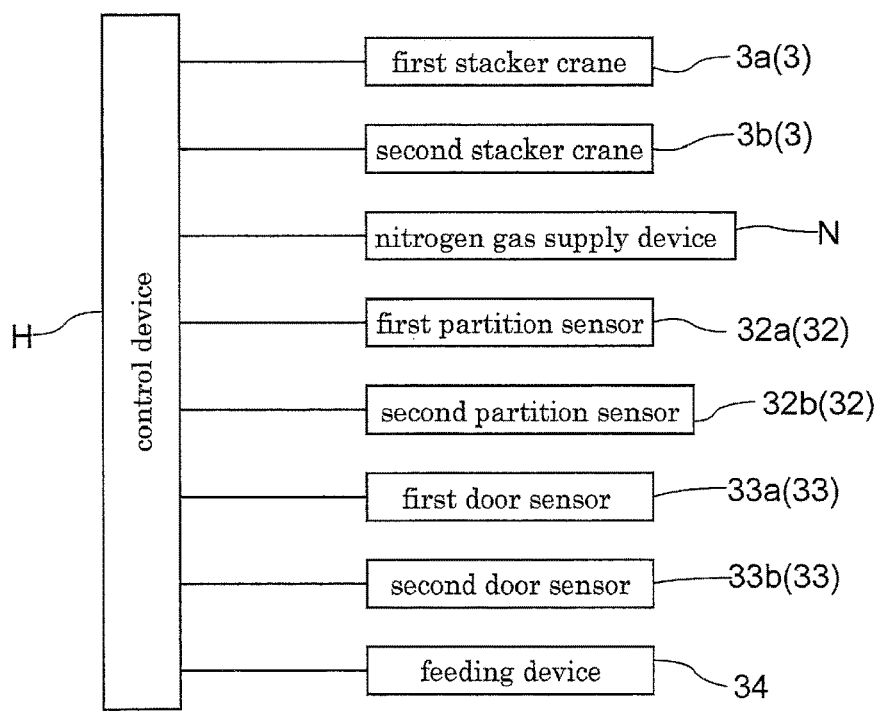
FIG. 7 is a control block diagram.

As shown in FIGS. 4 and 7, the article storage facility is provided with a partition state detection device 32 (a first partition sensor 32a and a second partition sensor 32b) that detects the state of installation of the partition body 5, and a door state detection device 33 (a first door sensor 33a and a second door sensor 33b) that detects the open/closed state of the opening/closing door 24. Note that the illustration of the partition state detection device 32 and the door state detection device 33 has been omitted in FIGS. 5, 6 and so forth.

The partition state detection device 32 includes a first partition sensor 32a that detects that the partition body 5 has been switched to the installed position (installed state), and a second partition sensor 32b that detects that the partition body 5 has been switched to the retracted position (retracted state).

That is, when the partition body 5 is located at the installed position, the first partition sensor 32a is in a detecting state and the second partition sensor 32b is in a non-detecting state. When the partition body 5 is located at the retracted position, the first partition sensor 32a is in the non-detecting state and the second partition sensor 32b is in the detecting state. When the partition body 5 is located between the installed position and the retracted position, and is located at neither the installed position nor the retracted position, both of the first partition sensor 32a and the second partition sensor 32b are in the non-detecting state.

The door state detection device 33 includes a first door sensor 33a that detects that the opening/closing door 24 is located at an end of the opening 23 on the first path portion 8a side in the lateral width direction of the rack, and a second door sensor 33b that detects that the opening/closing door 24 is located at an end of the opening 23 on the second path portion 8b side in the lateral width direction of the rack.

That is, when the opening/closing door 24 is switched to the extended position (switched to the closed state), both of the first door sensor 33a and the second door sensor 33b are in the detecting state.

When the opening/closing door 24 is switched to the contracted position to be brought closer to an end of the opening 23 on the second interior space 4b side (switched to the first open state), the first door sensor 33a is in the non-detecting state and the second door sensor 33b is in the detecting state. In this state, the second entrance 23B (second opening portion 23b) is closed by the opening/closing door 24.

When the opening/closing door 24 is switched to the contracted position to be brought closer to an end of the opening 23 on the first interior space 4a side (switched to the second open state), the first door sensor 33a is in the detecting state and the second door sensor 33b is in the non-detecting state. In this state, the first entrance 23A (first opening portion 23a) is closed by the opening/closing door 24. When the opening/closing door 24 is switched to a position that is not the extended position and is not brought closer to the end of the opening 23 on the first interior space 4a side or the end on the second interior space 4b side, both of the first door sensor 33a and the second door sensor 33b are in the non-detecting state.

The article storage facility is provided with a control device H that controls the operation of the stacker crane 3 and the operation of the nitrogen gas supply device N. That is, the control device H has the function as a transport control device that controls the operation of the stacker crane 3, and the function as a supply control device that controls the operation of the nitrogen gas supply device N.

The control device H selectively performs a first transport control, a second transport control, and a third transport control. In other words, a plurality of transport controls selectively performed by the control device H includes a first transport control, a second transport control, and a third transport control.

In the first transport control, the operations of the first stacker crane 3a and the second stacker crane 3b are controlled by the control device H in order to cause the first stacker crane 3a to travel only in the first path portion 8a to transport containers W and cause the second stacker crane 3b to travel only in the second path portion 8b to transport containers W. In other words, the first transport control is a transport control in which the first stacker crane 3a is moved only in the first path portion 8a to transport containers W and the second stacker crane 3b is moved only in the second path portion 8b to transport containers W.

That is, by performing the first transport control, containers W are transported by the first stacker crane 3a between the internal transfer area 6i and the storage sections 1 in the first interior space 4a, and containers W are transported by the second stacker crane 3b between the internal transfer area 6i and the storage sections 1 in the second interior space 4b.

In the second transport control, the operation of the selected one of the stacker cranes 3 is controlled by the control device H in order to cause the first stacker crane 3a to travel only in the first path portion 8a to transport containers W, or cause the second stacker crane 3b to travel only in the second path portion 8b to transport containers W. In other words, the second transport control is a transport control that is performed on the selected one of the first stacker crane 3a and the second stacker crane 3b as a target stacker crane such that the target stacker crane is moved only in the first path portion 8a to transport articles when the target stacker crane is the first stacker crane 3a, and that the target stacker crane is moved only in the second path portion 8b to transport articles when the target stacker crane is the second stacker crane 3b. In the present embodiment, the target stacker crane corresponds to "target article transport device".

That is, when the first stacker crane 3a is selected (the target stacker crane is the first stacker crane 3a), containers W are transported by the first stacker crane 3a between the internal transfer area 6i and the storage sections 1 in the first interior space 4a by performing the second transport control. When the second stacker crane 3b is selected (the target stacker crane is the second stacker crane 3b), containers W are transported by the second stacker crane 3b between the internal transfer area 6i and the storage sections 1 in the second interior space 4b by performing the second transport control.

In the third transport control, the operation of the selected stacker crane 3 is controlled by the control device H in order to cause the selected one of the stacker cranes 3 to travel in both the first path portion 8a and the second path portion 8b to transport containers W. For example, the first stacker crane 3a is caused to travel in both the first path portion 8a and the second path portion 8b to transport containers W, or the second stacker crane 3b is caused to travel in both the first path portion 8a and the second path portion 8b to transport containers W. In other words, the third transport control is a transport control in which the target stacker crane is moved in both the first path portion 8a and the second path portion 8b to transport articles.

That is, when the first stacker crane 3a is selected (the target stacker crane is the first stacker crane 3a), containers W are transported by the first stacker crane 3a between the internal transfer area 6i and the storage sections 1 in the first interior space 4a and the second interior space 4b by performing the third transport control. When the second stacker crane 3b is selected (the target stacker crane is the second stacker crane 3b), containers W are transported by the second stacker crane 3b between the internal transfer area 6i and the storage sections 1 in the first interior space 4a and the second interior space 4b by preforming the third transport control.

Note that the third transport control corresponds to a full path transport control in which the operation of the stacker crane 3 is controlled by the control device H in order to move the stacker crane 3 in both the first path portion 8a and the second path portion 8b to transport containers W. In other words, the full path transport control is a transport control in which the stacker crane 3 is moved in both the first path portion 8a and the second path portion 8b to transport containers W. Further, the first transport control and the second transport control correspond to a partial path transport control in which the operation of the stacker crane 3 is controlled in order to move the stacker crane 3 in one of the first path portion 8a and the second path portion 8b to transport containers W. In other words, the partial path transport control is a transport control in which the stacker crane 3 is moved in one of the first path portion 8a and the second path portion 8b to transport containers W. Accordingly, the control device H is configured to selectively perform the full path transport control and the partial path transport control. In other words, the plurality of transport controls selectively performed by the control device H include the full path transport control and the partial path transport control.

The control device H selectively performs a full supply control and a partial supply control. In other words, a plurality of supply controls selectively performed by the control device H include a full supply control and a partial supply control.

In the full supply control, the operation of the nitrogen gas supply device N is controlled by the control device H in order to supply a nitrogen gas to the containers W stored in the storage sections 1 in both of the first interior space 4a and the second interior space 4b. In other words, the full supply control is a supply control in which a nitrogen gas is supplied to the containers W stored in the storage sections 1 in both of the first interior space 4a and the second interior space 4b. In the partial supply control, the operation of the nitrogen gas supply device N is controlled by the control device H in order to supply a nitrogen gas to the containers W stored in the storage sections 1 in one of the first interior space 4a and the second interior space 4b. In other words, the partial supply control is a supply control in which a nitrogen gas is supplied to the containers W stored in the storage sections 1 in one of the first interior space 4a and the second interior space 4b.

The control device H is configured to control a feeding device 34 based on detection information from each of the partition state detection device 32 (the first partition sensor 32a, the second partition sensor 32b) and the door state detection device 33 (the first door sensor 33a, the second door sensor 33b) to perform switching between a feeding state and a feed interruption state for the state of power feeding to the stacker crane 3 located in the first path portion 8a, and switching between the feeding state and the feed interruption state for the state of power feeding to the stacker crane 3 located in the second path portion 8b.

Also, the control device H is configured to control the feeding device 34 based on detection information from each of the partition state detection device 32 (the first partition sensor 32a, the second partition sensor 32b) and the door state detection device 33 (the first door sensor 33a, the second door sensor 33b) to perform switching between the feeding state and the feed interruption state for the state of power feeding to a first space portion, and switching between the feeding state and the feed interruption state for the state of power feeding to a second space portion. Here, the first space portion is a portion of the nitrogen gas supply device N that supplies a nitrogen gas to the containers W stored in the storage sections 1 in the first interior space 4a, and a second space portion is a portion of the nitrogen gas supply device N that supplies a nitrogen gas to the containers W stored in the storage sections 1 in the second interior space 4b.

The control of the feeding device 34 by the control device H based on the detection information from each of the first partition sensor 32a, the second partition sensor 32b, the first door sensor 33a and the second door sensor 33b is performed based on the conditions described in FIG. 11.

That is, in the case of performing the first transport control, the power supply device 43 is controlled by the control device H in order to feed power to both the first interior space 4a and the second interior space 4b in a state in which the first partition sensor 32a is in the detecting state and the second partition sensor 32b is in the non-detecting state (the partition body 5 is in the installed state), and in which the first door sensor 33*a* and the second door sensor 33*b* are in the detecting state (the opening/closing door 24 is in the closed state).

Here, "to feed power to the first interior space 4*a*" means to feed power to the first stacker crane 3*a* located in the first path portion 8*a* and to feed power to the first space portion of the nitrogen gas supply device N. "To feed power to the second interior space 4*b*" means to feed power to the second stacker crane 3*b* located in the second path portion 8*b* and to feed power to the second space portion of the nitrogen gas supply device N.

In the case of performing the second transport control (the first stacker crane 3*a* is selected), the feeding device 34 is controlled by the control device H in order to feed power to the first interior space 4*a* and interrupt power feeding to the second interior space 4*b* in a state in which the first partition sensor 32*a* is in the detecting state and the second partition sensor 32*b* is in the non-detecting state (the partition body 5 is in the installed state), and in which the first door sensor 33*a* is in the detecting state and the second door sensor 33*b* is in the non-detecting state (the opening/closing door 24 is in the second open state).

In the case of performing the second transport control (the second stacker crane 3*b* is selected), the feeding device 34 is controlled by the control device H in order to interrupt power feeding to the first interior space 4*a* and feed power to the second interior space 4*b* in a state in which the first partition sensor 32*a* is in the detecting state and the second partition sensor 32*b* is in the non-detecting state (the partition body 5 is in the installed state), and in which the first door sensor 33*a* is in the non-detecting state and the second door sensor 33*b* is in the detecting state (the opening/closing door 24 is in the first open state).

In the case of performing the third transport control, the feeding device 34 is controlled by the control device H in order to feed power to both the first interior space 4*a* and the second interior space 4*b* in a state in which the first partition sensor 32*a* is in the non-detecting state and the second partition sensor 32*b* is in the detecting state (the partition body 5 is in the retracted state), and in which both of the first door sensor 33*a* and the second door sensor 33*b* are in the detecting state (the opening/closing door 24 is in the closed state).

In the case of performing any of the first to third transport controls, the feeding device 34 is controlled by the control device H in order to interrupt power feeding to each of the first interior space 4*a* and the second interior space 4*b* when a combination of the detecting states of the first partition sensor 32*a*, the second partition sensor 32*b*, the first door sensor 33*a* and the second door sensor 33*b* is other than the above-described states.

That is, in the case of performing the first transport control, power is fed to both the first interior space 4*a* and the second interior space 4*b* when the partition body 5 is in the installed state and the opening/closing door 24 is in the closed state.

Accordingly, the traveling of the first stacker crane 3*a* in the first path portion 8*a* and the traveling of the second stacker crane 3*b* in the second path portion 8*b* are allowed when the partition body 5 is in the installed state and the opening/closing door 24 is in the closed state. Then, by the control device H performing the first transport control, the first stacker crane 3*a* travels in the first path portion 8*a* to transport containers W, and the second stacker crane 3*b* travels in the second path portion 8*b* to transport containers W. Further, power is fed to both the first space portion and the second space portion of the nitrogen gas supply device N, and the full supply control is performed by the control device H.

In the case of performing the first transport control, power feeding to each of the first interior space 4*a* and the second interior space 4*b* is interrupted by the partition body 5 being operated to move from the installed state to the retracted state or by the opening/closing door 24 being operated to open from the closed state, from the state in which the partition body 5 is in the installed state and the opening/closing door 24 is in the closed state.

Accordingly, in the case of performing the first transport control, other than when the partition body 5 is in the installed state and the opening/closing door 24 is in the closed state, the traveling of the first stacker crane 3*a* in the first path portion 8*a* and the traveling of the second stacker crane 3*b* in the second path portion 8*b* are inhibited and the first stacker crane 3*a* and the second stacker crane 3*b* are stopped. Further, power feeding to both the first space portion and the second space portion of the nitrogen gas supply device N is interrupted, and the supply of a nitrogen gas to the containers W stored in the storage sections 1 in both of the first interior space 4*a* and the second interior space 4*b* is stopped.

Next, a case where the control device H performs the second transport control will be described for a second transport control (the first stacker crane 3*a* is selected), and the description of a second transport control (the second stacker crane 3*b* is selected) has been omitted.

In the second transport control (the first stacker crane 3*a* is selected), power is fed to the first interior space 4*a* and power feeding to the second interior space 4*b* is interrupted when the partition body 5 is in the installed state and the opening/closing door 24 is in the second open state.

Accordingly, the movement of the first stacker crane 3*a* is allowed when the partition body 5 is in the installed state and the opening/closing door 24 is in the second open state. Then, the first stacker crane 3*a* travels in the first path portion 8*a* to transport containers W by the control device H performing the second transport control (the first stacker crane 3*a* is selected). Further, power is fed to the first space portion of the nitrogen gas supply device N, and the control device H performs the partial supply control in which a nitrogen gas is supplied to the containers W stored in the storage sections 1 in the first interior space 4*a*.

In the case of performing the second transport control (the first stacker crane 3*a* is selected), power feeding to the first interior space 4*a* is interrupted by the partition body 5 being operated to move from the installed state to the retracted state or by the opening/closing door 24 being operated from the second open state, from the state in which the partition body 5 is in the installed state and the opening/closing door 24 is in the second open state.

Accordingly, in the case of performing the second transport control (the first stacker crane 3*a* is selected), other than when the partition body 5 is in the installed state and the opening/closing door 24 is in the second open state, the traveling of the first stacker crane 3*a* in the first path portion 8*a* and the traveling of the second stacker crane 3*b* in the second path portion 8*b* are inhibited, and the first stacker crane 3*a* and the second stacker crane 3*b* are stopped. Further, power feeding to both the first space portion and the second space portion of the nitrogen gas supply device N is interrupted, and the supply of a nitrogen gas to the containers W stored in the storage sections 1 in both of the first interior space 4*a* and the second interior space 4*b* is stopped.

Next, a case where the third transport control is performed will be described. The description will be given of a case where the second stacker crane 3b is selected (the first stacker crane 3a is removed from the traveling path 8), and the description of a case where the first stacker crane 3a is selected (the second stacker crane 3b is removed from the traveling path 8) has been omitted.

In the third transport control, power is fed to both the first interior space 4a and the second interior space 4b when the partition body 5 is in the retracted state and the opening/closing door 24 is in the closed state.

Accordingly, the traveling of the second stacker crane 3b in the first path portion 8a and the second path portion 8b is allowed when the partition body 5 is in the retracted state and the opening/closing door 24 is in the closed state. Then, the second stacker crane 3b travels in both the first path portion 8a and the second path portion 8b to transport the containers W by the control device H performing the third transport control. Further, power is fed to both the first space portion and the second space portion of the nitrogen gas supply device N, and the full supply control is performed by the control device H.

In the case of performing the third transport control, the power feeding to both the first interior space 4a and the second interior space 4b is interrupted by the partition body 5 being operated to move from the retracted state toward the installed state or by the opening/closing door 24 being operated to open from the closed state, from the state in which the partition body 5 is in the retracted state and the opening/closing door 24 is in the closed state.

Accordingly, in the case of performing the third transport control, other than when the partition body 5 is in the retracted state and the opening/closing door 24 is in the closed state, the traveling of the second stacker crane 3b is inhibited in both the first path portion 8a and the second path portion 8b, and the second stacker crane 3b is stopped. Further, power feeding to both the first space portion and the second space portion of the nitrogen gas supply device N is interrupted, and the supply of a nitrogen gas to the containers W stored in the storage sections 1 in both of the first interior space 4a and the second interior space 4b is stopped.

Thus, by the control device H performing the first transport control and the full supply control or performing the third transport control and the full supply control in this manner, it is possible to cause the stacker crane 3 to travel in both the first path portion 8a and the second path portion 8b to transport containers W, and supply a nitrogen gas to the containers W stored in the storage sections 1 in both of the first interior space 4a and the second interior space 4b. When the operator has opened the opening/closing door 24 and entered the traveling path 8, the stacker crane 3 is caused to make an emergency stop, and the supply of a nitrogen gas is stopped.

By the control device H performing the second transport control and the partial supply control, it is possible to allow the operator to perform a maintenance operation in one of the first path portion 8a and the second path portion 8b, while causing the stacker crane 3 to travel in the other path portion to transport containers W, and supply a nitrogen gas to the containers W stored in the storage sections 1 in the first interior space 4a or the second interior space 4b in which the containers W are being transported by the stacker crane 3. Since communication between the first interior space 4a and the second interior space 4b is shut off by the partition body 5, it is possible to prevent the operator from entering one path portion to the other path portion, while preventing a nitrogen gas from flowing into one path portion from the other path portion.

Alternative Embodiments (1) Although two stacker cranes 3, namely, the first stacker crane 3a and the second stacker crane 3b, are provided as the stacker crane 3, in the above-described embodiment, only one stacker crane 3 may be provided. In this case, the control device H performs the second transport control (partial path transport control) and the third transport control (full path transport control) from among the first to third transport controls. In the second transport control, one stacker crane 3 that is provided is caused to travel only in the first path portion 8a or only in the second path portion 8b to transport containers W as the selected stacker crane 3 (target stacker crane). In the third transport control, one stacker crane 3 that is provided is caused to travel in both the first path portion 8a and the second path portion 8b to transport containers W as the selected stacker crane 3.

Although the traveling path 8 includes two path portions, namely, the first path portion 8a and the second path portion 8b, in the above-described embodiment, the traveling path 8 may include three or more path portions. Although only one stacker crane 3 is provided in one path portion in the above-described embodiment, a plurality of stacker cranes 3 may be provided in one path portion. For example, two first stacker cranes 3a may be provided in one path portion.

(2) In the above-described embodiment, in the case where the control device H performs the first transport control or the full supply control, power feeding to both the first interior space 4a and the second interior space 4b is interrupted when the opening/closing door 24 is operated to open from the closed state (one of the first door sensor 33a and the second door sensor 33b is in the non-detecting state). However, power feeding may be interrupted in the following manner.

That is, in the case where the control device H performs the first transport control and the full supply control, power feeding to only the first interior space 4a is interrupted when the opening/closing door 24 is operated to open from the closed state toward the first open state (only the first door sensor 33a is in the non-detecting state), and power feeding to only the second interior space 4b is interrupted when the opening/closing door 24 is operated to open from the closed state toward the second open state (only the second door sensor 33b is in the non-detecting state). Then, power feeding to both the first interior space 4a and the second interior space 4b is interrupted when the partition body 5 is moved from the installed state (the first partition sensor 32a is in the non-detecting state).

(3) Although the opening/closing door 24 is configured to be extended and contracted in the lateral width direction of the rack by being bent and stretched in the above-described embodiment, it is possible to adopt a configuration in which the opening/closing door 24 includes a plurality of door portions, and the opening/closing door 24 is extended and contracted in the lateral width direction of the rack by slidably moving the door portions along the lateral width direction of the rack.

Specifically, it is possible to adopt a configuration in which the opening/closing door 24 includes a first door portion that closes the first opening portion 23a, a second door portion that closes the second opening portion 23b, a third door portion that closes the third opening portion 23c, and the first entrance 23A is opened and closed by operating the first door portion and the third door portion to slide and the second entrance 23B is opened and closed by operating the second door portion and the third door portion to slide.

(4) Although the partition body 5 is configured by three members, namely, the fixed portion 27, the slide portion 28, and the pivot portion 29, in the above-described embodiment, the configuration of the partition body 5 may be changed as appropriate. For example, it is possible to adopt a partition body 5 configured by the fixed portion 27 and a plurality of slide portions 28, a partition body 5 configured to be extended and contracted in the front-rear direction of the rack by being bent and stretched as with the opening/closing door 24, and so forth.

(5) Although a part of the opening 23 is shared by the first entrance 23A and the second entrance 23B in the above-described embodiment, the first entrance 23A and the second entrance 23B may be provided so as to be arranged side by side in the lateral width direction of the rack, without sharing a part of the opening 23 by the first entrance 23A and the second entrance 23B.

(6) In the above-described embodiment, the operative connection mechanism that operatively connects the partition body 5 with the opening/closing door 24 is configured by the door strut members 25 and the partition body strut member 30 that are movable in the lateral width direction of the rack, and the partition body 5 is switched between the first partition position and the second partition position by operating the partition body strut member 30 to be pushed in lateral width direction of the rack by the door strut members 25. However, the configuration of the operative connection mechanism may be changed as appropriate. For example, opposite ends of the opening/closing door 24 and the partition body strut member 30 may be connected by using a strand member such as a wire, and the partition body 5 may be switched between the first partition position and the second partition position by operating the partition body strut member 30 to be pulled in the lateral width direction of the rack by the wire.

It is also possible to adopt a configuration in which the partition body 5 and the opening/closing door 24 are operated separately, without using such an operative connection mechanism.

(7) Although the inactive gas supply device (nitrogen gas supply device N) that supplies an inactive gas to the articles stored in the storage sections 1 is provided in the above-described embodiment, the inactive gas supply device need not be provided when the articles do not require the supply of an inactive gas, for example. Note that, aside from a nitrogen gas, an argon gas or the like may be used as the inactive gas.

When the inactive gas supply device is not provided, a fence-like or a net-like surrounding body may be provided in place of the wall body K so as to surround the interior space 4 when viewed in plan view. Further, the partition body 5 need not be formed to be non-porous and may be formed by a fence, a bar, or a net when the inactive gas supply device is not provided.

(8) Although the control device H selectively performs the full supply control and the partial supply control in the above-described embodiment, the control device H may perform only the full supply control. Specifically, the full supply control may be performed when the conditions for the detecting states of the sensors are satisfied in the first transport control or the third transport control, and the supply of an inactive gas to the articles in the second transport control may be stopped.

Outline of the Embodiment

Hereinafter, an outline of the article storage facility described above will be described.

An article storage facility including: an article storage rack including a plurality of storage sections that store articles; a plurality of article transport devices that move in front of the article storage rack, along a lateral width direction of the rack to transport the articles; and a transport control device that controls operation of the plurality of article transport devices, wherein a movement path in which the plurality of article transport devices move includes a first path portion and a second path portion that are arranged side by side in the lateral width direction of the rack, the plurality of article transport devices include a first article transport device and a second article transport device, a plurality of transport controls selectively performed by the transport control device include a first transport control and a second transport control, the first transport control is a transport control in which the first article transport device is moved only in the first path portion to transport the articles and the second article transport device is moved only in the second path portion to transport the articles, the second transport control is a transport control performed on a selected one of the first article transport device and the second article transport device as a target article transport device such that the target article transport device is moved only in the first path portion to transport the articles when the target article transport device is the first article transport device, and that the target article transport device is moved only in the second path portion to transport the articles when the target article transport device is the second article transport device, and a partition body is provided that is switchable between an installed state in which the partition body is installed in a path boundary area serving as a boundary area between the first path portion and the second path portion in the movement path to shut off communication between the first path portion and the second path portion, and a retracted state in which the partition body is retracted from the path boundary area to open the path boundary area.

With this configuration, by the transport control device performing the first transport control, the first article transport device moves in the first path portion to transport articles, and the second article transport device moves in the second path portion to transport articles. Thus, it is possible to perform both the transport of articles by moving the first article transport device in the first path portion, and the transport of articles by moving the second article transport device in the second path portion.

When the operator performs a maintenance operation on one of the first article transport device and the second article transport device, the transport control device performs the second transport control for the article transport device on which the maintenance operation is not performed as the selected article transport device (target article transport device), thereby making it possible to allow the operator to perform the maintenance operation on the article transport device in one of the first movement path and the second movement path, while transporting articles by moving the target article transport device in the other of the second movement path and the first movement path.

For example, when the operator who is performing a maintenance operation on the first article transport device in the first path portion has stepped out into the second path portion, the operator may come into contact with the second article transport device that is moving in the second path portion.

Therefore, the partition body that is switchable between the installed state and the retracted state is provided, and the partition body is installed in the installed state. Thereby, when the operator is about to enter the second path portion, the operator comes into contact with the partition body in the installed state, thus making it possible to physically prevent the operator from entering the second path portion. Further, it is possible to prevent the operator from entering the second path portion by enabling the operator to confirm the presence of the partition body in the installed state and be aware of his or her own location. As a result, it is possible to prevent the operator from coming into contact with the article transport device that is moving.

Thus, even if the operator has entered a part of the movement path, it is possible to continue transporting articles by the article transport device in the remaining part of the movement path, while preventing the operator who has entered the movement path from coming into contact with the article transport device.

Here, it is preferable that the plurality of transport controls include a third transport control, and the third transport control is a transport control in which the target article transport device is moved in both the first path portion and the second path portion to transport the articles.

With this configuration, the target article transport device moves in both the first path portion and the second path portion to transport articles by the transport control device performing the third transport control.

That is, for example, when an attempt is made to perform a maintenance operation on an article transport device while the article transport device is kept positioned in the movement path, the maintenance operation may not be able to be performed because of the narrow movement path. In such a case, the article transport device on which the maintenance work is to be performed may be transported out of the movement path, and the maintenance operation may be performed on the article transport device outside the movement path.

In this case, the transport control device performs the third transport control, thereby making it possible to move the target article transport device in both the first path portion and the second path portion to transport articles.

It is preferable that the article storage facility includes a surrounding body that surrounds a space including both an installation space in which the article storage rack is installed and the movement path, when viewed in plan view, wherein the surrounding body is provided with a first entrance from which an operator enters and exits the first path portion, a first door that opens and closes the first entrance, a second entrance from which the operator enters and exits the second path portion, and a second door that opens and closes the second entrance, a partition state detection device that detects a state of installation of the partition body and a door state detection device that detects an open/closed state of the first door and the second door are provided, and the transport control device is configured to, based on detection information from each of the partition state detection device and the door state detection device, allow movement of the target article transport device in the third transport control when both of the first door and the second door are in a closed state and the partition body is in the retracted state; and inhibit movement of the target article transport device in the third transport control when at least one of the first door and the second door is not in the closed state or when the partition body is not in the retracted state.

With this configuration, the movement of the target article transport device is allowed in the third transport control when both of the first door and the second door are in the closed state and the partition body is in the retracted state, and, accordingly, the target article transport device moves in both the first path portion and the second path portion to transport articles by the transport control device performing the third transport control.

When entering the path portion, the operator enters the first path portion by operating the first door to open or enters the second path portion by operating the second door to open. However, the movement of the target article transport device is inhibited when the first door or the second door is no longer in the closed state by being operated to open by the operator. Accordingly, when the first door or the second door is operated to open by the operator, the target article transport device is inhibited from moving and is stopped, and thereby, the article transport device can be prevented from coming into contact with the operator who has entered the movement path.

When the partition body is not in the retracted state (e.g., when it is in the installed state), the article transport device that is moving across the first path portion and the second path portion may come into contact with the partition body. However, when the partition body is not in the retracted state, the movement of the target article transport device is inhibited. Accordingly, when the partition body is not in the retracted state, the target article transport device is inhibited from moving and is stopped, and thereby, the article transport device can be prevented from coming into contact with the partition body.

An article storage facility including: an article storage rack including a plurality of storage sections that store articles; an article transport device that moves in front of the article storage rack, along a lateral width direction of the rack to transport the articles; and a transport control device that controls operation of the article transport device, wherein a movement path in which the article transport device moves includes a first path portion and a second path portion that are arranged side by side in the lateral width direction of the rack, a plurality of transport controls selectively performed by the transport control device include a full path transport control and a partial path transport control, the full path transport control is a transport control in which the article transport device is moved in both the first path portion and the second path portion to transport the articles, the partial path transport control is a transport control in which the article transport device is moved in one of the first path portion and the second path portion to transport the articles, a partition body is provided that is switchable between an installed state in which the partition body is installed in a path boundary area serving as a boundary area between the first path portion and the second path portion in the movement path to shut off communication between the first path portion and the second path portion, and a retracted state in which the partition body is retracted from the path boundary area to open the path boundary area.

With this configuration, the article transport device moves in both the first path portion and the second path portion to transport articles by the transport control device performing the full path transport control.

For example, when the operator performs a maintenance operation on the article storage rack or the like in the first path portion, it is possible to move the article transport device only in the second path portion, in which the operator is not performing the maintenance operation, to transport articles by the transport control device performing the partial path transport control. Thus, it is possible to allow the operator to perform a maintenance operation on the article storage rack or the like in one of the first movement path and the second movement path, while moving the article transport device in the other of the second movement path and the first movement path to transport articles.

For example, when the operator who is performing a maintenance operation on the article storage rack or the like in the first path portion has stepped out into the second path portion, the operator may come into contact with the article transport device that is moving in the second path portion.

Therefore, by providing the partition body that is switchable between the installed state and the retracted state and installing the partition body in the installed state, the operator comes into contact with the partition body in the installed state when the operator is about to enter the second path portion, thus making it possible to physically prevent the operator from entering the second path portion. Furthermore, it is possible to prevent the operator from entering the second path portion by enabling the operator to confirm the presence of the partition body in the installed state and be aware of his or her location. As a result, it is possible to prevent the operator from coming into contact with the article transport device that is moving.

Thus, even if the operator has entered a part of the movement path, it is possible to continue transporting articles by the article transport device in the remaining portion of the movement path, while preventing the operator who has entered the movement path from coming into contact with the article transport device.

It is preferable that the article storage facility includes a surrounding body that surrounds a space including both an installation space in which the article storage rack is installed and the movement path, when viewed in plan view, wherein the surrounding body is provided with a first entrance from which an operator enters and exits the first path portion, a first door that opens and closes the first entrance, a second entrance from which the operator enters and exits the second path portion, and a second door that opens and closes the second entrance, a partition state detection device that detects a state of installation of the partition body and a door state detection device that detects an open/closed state of the first door and the second door are provided, and the transport control device is configured to, based on detection information from each of the partition state detection device and the door state detection device, allow movement of the article transport device in the full path transport control when both of the first door and the second door are in a closed state and the partition body is in the retracted state; and inhibit movement of the article transport device in the full path transport control when at least one of the first door and the second door is not in the closed state or when the partition body is not in the retracted state.

With this configuration, the movement of the article transport device is allowed in the full path transport control when both of the first door and the second door are in the closed state and the partition body is in the retracted state, and, accordingly, the article transport device moves in both the first path portion and the second path portion to transport articles by the transport control device performing the full path transport control.

When entering the path portion, the operator enters the first path portion by operating the first door to open or enters the second path portion by operating the second door to open. However, the movement of the article transport device is inhibited when the first door or the second door is no longer in the closed state by being operated to open by the operator. Accordingly, when the first door or the second door is operated to open by the operator, the article transport device is inhibited from moving and is stopped, and thereby, the article transport device can be prevented from coming into contact with the operator who has entered the movement path.

When the partition body is not in the retracted state (e.g., when it is in the installed state), the article transport device that is moving across the first path portion and the second path portion may come into contact with the partition body. However, when the partition body is not in the retracted state, the movement of the article transport device is inhibited. Accordingly, when the partition body is not in the retracted state, the article transport device is inhibited from moving and is stopped, and thereby, the article transport device can be prevented from coming into contact with the partition body.

It is preferable that the article storage facility includes: a wall body that covers an interior space including both an installation space in which the article storage rack is installed and the movement path; an inactive gas supply device that supplies an inactive gas to the articles stored in the storage sections; and a supply control device that controls operation of the inactive gas supply device, wherein the wall body is provided with a first entrance from which an operator enters and exits the first path portion, a first door that opens and closes the first entrance, a second entrance from which the operator enters and exits the second path portion, and a second door that opens and closes the second entrance, the interior space includes a first interior space and a second interior space that are arranged side by side in the lateral width direction of the rack, the partition body is installed in the installed state so as to be located in a boundary area between the first interior space and the second interior space to divide the interior space into the first interior space and the second interior space, a plurality of supply controls selectively performed by the supply control device include a full supply control and a partial supply control, the full supply control is a supply control in which the inactive gas is supplied to the articles stored in the storage sections in both of the first interior space and the second interior space, and the partial supply control is a supply control in which the inactive gas is supplied to the articles stored in the storage sections in one of the first interior space and the second interior space.

With this configuration, an inactive gas is supplied to articles by the inactive gas supply device when the articles are stored in the storage sections, thereby making it possible to suppress the occurrence of failures in the articles. For example, when the articles are containers accommodating semiconductor substrates, oxidation of the semiconductor substrates can be suppressed by supplying the inactive gas into the containers.

Meanwhile, an excess inactive gas is discharged from articles when the inactive gas is supplied to the articles. When the inactive gas is discharged to the interior space, the concentration of the inactive gas in the interior space increases. To prevent the operator from preforming a maintenance operation in an interior space having such a high inactive gas concentration, the interior space can be divided into the first interior space and the second interior space by selectively performing the full supply control and the partial supply control by the supply control device and installing the partition body in the installed state.

That is, by performing the full supply control when the operator enters neither the first interior space nor the second interior space, the inactive gas supply device can supply an inactive gas to the articles stored in the storage sections in both of the first interior space and the second interior space.

Then, it is possible to allow the operator to perform an operation in one of the interior spaces, while supplying the inactive gas to the articles stored in the storage sections in the other interior space by the inactive gas supply device. For example, the inactive gas is supplied to the articles stored in the storage sections in the second interior space when the operator enters the first path portion of the first interior space in a state in which the partition body is switched to the installed state, and the inactive gas is supplied to the articles stored in the storage sections in the first interior space when the operator enters the second path portion of the second interior space.

It is preferable that a door state detection device that detects an open/closed state of the first door and the second door is provided, and the supply control device is configured to, based on detection information from the door state detection device, allow supply of the inactive gas to the articles stored in the storage sections in both of the first interior space and the second interior space when the first door and the second door are in the closed state; and stop supply of the inactive gas to the articles stored in the storage sections in both of the first interior space and the second interior space when the first door is operated to open from the closed state or when the second door is operated to open from the closed state.

With this configuration, it is possible to supply the inactive gas to the articles stored in the storage sections in both of the first interior space and the second interior space by controlling the operation of the inactive gas supply device by the supply control device when both of the first door and the second door are in the closed state.

When the first door is operated to open from the closed state or when the second door is operated to open from the closed state, the supply of the inactive gas to the articles stored in the storage sections in both of the first interior space and the second interior space is stopped.

That is, the supply of the inactive gas to the articles stored in the storage sections in the interior space is stopped when the operator attempts to enter the interior space by operating the first door or the second door to open. Accordingly, it is possible to prevent the inactive gas from being supplied to the articles stored in the storage sections in the interior space in a state in which the operator has entered the interior space.

It is preferable that the article storage facility includes a wall body that covers an interior space including both an installation space in which the article storage rack is installed and the movement path, wherein the wall body is provided with an opening from which an operator enters and exits the movement path and an opening/closing door that opens and closes the opening, the interior space includes a first interior space and a second interior space that are arranged side by side in the lateral width direction of the rack, the partition body is installed in the installed state so as to be located in a boundary area between the first interior space and the second interior space to divide the interior space into the first interior space and the second interior space, the opening is formed so as to extend across the path boundary area toward both the first interior space and the second interior space in the lateral width direction of the rack, and is also formed by a first opening portion, a second opening portion, and a third opening portion, the first opening portion is formed at a position at which the entire opening region thereof overlaps the first interior space when viewed in a front-rear direction of the rack, the second opening portion is formed at a position at which the entire opening region thereof overlaps the second interior space when viewed in the front-rear direction of the rack, the third opening portion is formed so as to be located between the first opening portion and the second opening portion in the lateral width direction of the rack, and to include an opening region that overlaps the first interior space when viewed in the front-rear direction of the rack and an opening region that overlaps the second interior space when viewed in the front-rear direction of the rack, the first opening portion and the third opening portion form a first entrance from which the operator enters and exits the first path portion, the second opening portion and the third opening portion form a second entrance from which the operator enters and exits the second path portion, and the opening/closing door is configured to be extensible and contractible along the lateral width direction of the rack so as to be switchable between a closed state in which the opening/closing door is extended in the lateral width direction of the rack to close the entire opening, a first open state in which the opening/closing door is contracted in the lateral width direction of the rack to close only the second opening portion and open the first entrance in the opening, and a second open state in which the opening/closing door is contracted in the lateral width direction of the rack to close only the first opening portion and open the second entrance in the opening.

With this configuration, when entering the first interior space, the operator enters the first interior space from the first entrance by switching the opening/closing door to the first open state. When entering the second interior space, the operator enters the second interior space from the second entrance by switching the opening/closing door to the second open state.

The opening that is opened and closed by the opening/closing door is formed by the first opening portion, the second opening portion, and the third opening portion that are arranged side by side in the lateral width direction of the rack. The first entrance is formed by the first opening portion and the third opening portion, and the second entrance is formed by the second opening portion and the third opening portion. By sharing the third opening portion by the first entrance and the second entrance in this way, the opening can be made smaller in the lateral width direction of the rack than when the opening portion is not shared by the first entrance and the second entrance.

Accordingly, for example, when the article storage rack is provided such that the storage sections are located on opposite sides in the lateral width direction of the rack with respect to the opening, the interval between the storage sections located on the opposite sides can be reduced in the lateral width direction of the rack, thus making it possible to increase the article storage efficiency in the article storage facility.

It is preferable that the partition body is configured to be movable in the installed state between a first partition position at which an end of the partition body that is located toward the opening in the front-rear direction of the rack is located in a boundary area between the second opening portion and the third opening portion in the opening, and a second partition position at which the end is located in a boundary area between the first opening portion and the third opening portion in the opening, and an operative connection mechanism is provided that operatively connects the partition body with the opening/closing door such that the partition body moves to the first partition position as the opening/closing door is switched to the first open state, and that the partition body moves to the second partition position as the opening/closing door is switched to the second open state.

With this configuration, the partition body moves to the first partition position as the opening/closing door is switched to the first open state, and the partition body moves to the second partition position as the opening/closing door is switched to the second open state. Accordingly, the operations can be simplified compared with when the opening/closing door and the partition body are separately operated.

What is claimed is:

1. An article storage facility comprising:
   an article storage rack including a plurality of storage sections that store articles;
   a plurality of article transport devices that move in front of the article storage rack, along a lateral width direction of the rack to transport the articles; and
   a transport control device that controls operation of the plurality of article transport devices, wherein:
   a movement path in which the plurality of article transport devices move includes a first path portion and a second path portion that are arranged side by side in the lateral width direction of the rack,
   the plurality of article transport devices include a first article transport device and a second article transport device,
   a plurality of transport controls selectively performed by the transport control device include a first transport control and a second transport control,
   the first transport control is a transport control in which the first article transport device is moved only in the first path portion to transport the articles and the second article transport device is moved only in the second path portion to transport the articles,
   the second transport control is a transport control performed on a selected one of the first article transport device and the second article transport device as a target article transport device such that the target article transport device is moved only in the first path portion to transport the articles when the target article transport device is the first article transport device, and that the target article transport device is moved only in the second path portion to transport the articles when the target article transport device is the second article transport device, and
   a partition body is provided that is switchable between an installed state in which the partition body is installed in a path boundary area serving as a boundary area between the first path portion and the second path portion in the movement path to shut off communication between the first path portion and the second path portion, and a retracted state in which the partition body is retracted from the path boundary area to open the path boundary area,
   the plurality of transport controls include a third transport control, and
   the third transport control is a transport control in which the target article transport device is moved in both the first path portion and the second path portion to transport the articles, and
   further comprising a surrounding body that surrounds a space including both an installation space in which the article storage rack is installed and the movement path, when viewed in plan view, wherein:
   the surrounding body is provided with a first entrance from which an operator enters and exits the first path portion, a first door that opens and closes the first entrance, a second entrance from which the operator enters and exits the second path portion, and a second door that opens and closes the second entrance,
   a partition state detection device that detects a state of installation of the partition body and a door state detection device that detects an open/closed state of the first door and the second door are provided, and
   the transport control device is configured to, based on detection information from each of the partition state detection device and the door state detection device, allow movement of the target article transport device in the third transport control when both of the first door and the second door are in a closed state and the partition body is in the retracted state, and inhibit movement of the target article transport device in the third transport control when at least one of the first door and the second door is not in the closed state or when the partition body is not in the retracted state.

2. The article storage facility according to claim 1, further comprising a wall body that covers an interior space including both an installation space in which the article storage rack is installed and the movement path, and wherein:
   the wall body is provided with an opening from which an operator enters and exits the movement path and an opening/closing door that opens and closes the opening,
   the interior space includes a first interior space and a second interior space that are arranged side by side in the lateral width direction of the rack,
   the partition body is installed in the installed state so as to be located in a boundary area between the first interior space and the second interior space to divide the interior space into the first interior space and the second interior space,
   the opening is formed so as to extend across the path boundary area toward both the first interior space and the second interior space in the lateral width direction of the rack, and is also formed by a first opening portion, a second opening portion, and a third opening portion,
   the first opening portion is formed at a position at which the entire opening region thereof overlaps the first interior space when viewed in a front-rear direction of the rack,
   the second opening portion is formed at a position at which the entire opening region thereof overlaps the second interior space when viewed in the front-rear direction of the rack,
   the third opening portion is formed so as to be located between the first opening portion and the second opening portion in the lateral width direction of the rack, and to include an opening region that overlaps the first interior space when viewed in the front-rear direction of the rack and an opening region that overlaps the second interior space when viewed in the front-rear direction of the rack,
   the first opening portion and the third opening portion form a first entrance from which the operator enters and exits the first path portion,
   the second opening portion and the third opening portion form a second entrance from which the operator enters and exits the second path portion, and the opening/closing door is configured to be extensible and contractible along the lateral width direction of the rack so as to be switchable between a closed state in which the opening/closing door is extended in the lateral width direction of the rack to close the entire opening, a first open state in which the opening/closing door is contracted in the lateral width direction of the rack to close only the second opening portion and open the first entrance in the opening, and a second open state in which the opening/closing door is contracted in the lateral width direction of the rack to close only the first opening portion and open the second entrance in the opening.

3. The article storage facility according to claim 2, wherein:
the partition body is configured to be movable in the installed state between a first partition position at which an end of the partition body that is located toward the opening in the front-rear direction of the rack is located in a boundary area between the second opening portion and the third opening portion in the opening, and a second partition position at which the end is located in a boundary area between the first opening portion and the third opening portion in the opening, and
an operative connection mechanism is provided that operatively connects the partition body with the opening/closing door such that the partition body moves to the first partition position as the opening/closing door is switched to the first open state, and that the partition body moves to the second partition position as the opening/closing door is switched to the second open state.

4. An article storage facility comprising:
an article storage rack including a plurality of storage sections that store articles;
a plurality of article transport devices that move in front of the article storage rack, along a lateral width direction of the rack to transport the articles; and
a transport control device that controls operation of the plurality of article transport devices, wherein:
a movement path in which the plurality of article transport devices move includes a first path portion and a second path portion that are arranged side by side in the lateral width direction of the rack,
the plurality of article transport devices include a first article transport device and a second article transport device,
a plurality of transport controls selectively performed by the transport control device include a first transport control and a second transport control,
the first transport control is a transport control in which the first article transport device is moved only in the first path portion to transport the articles and the second article transport device is moved only in the second path portion to transport the articles,
the second transport control is a transport control performed on a selected one of the first article transport device and the second article transport device as a target article transport device such that the target article transport device is moved only in the first path portion to transport the articles when the target article transport device is the first article transport device, and that the target article transport device is moved only in the second path portion to transport the articles when the target article transport device is the second article transport device, a partition body is provided that is switchable between an installed state in which the partition body is installed in a path boundary area serving as a boundary area between the first path portion and the second path portion in the movement path to shut off communication between the first path portion and the second path portion, and a retracted state in which the partition body is retracted from the path boundary area to open the path boundary area,
further comprising:
a wall body that covers an interior space including both an installation space in which the article storage rack is installed and the movement path;
an inactive gas supply device that supplies an inactive gas to the articles stored in the storage sections; and
a supply control device that controls operation of the inactive gas supply device, wherein:
the wall body is provided with a first entrance from which an operator enters and exits the first path portion, a first door that opens and closes the first entrance, a second entrance from which the operator enters and exits the second path portion, and a second door that opens and closes the second entrance,
the interior space includes a first interior space and a second interior space that are arranged side by side in the lateral width direction of the rack,
the partition body is installed in the installed state so as to be located in a boundary area between the first interior space and the second interior space to divide the interior space into the first interior space and the second interior space,
a plurality of supply controls selectively performed by the supply control device include a full supply control and a partial supply control,
the full supply control is a supply control in which the inactive gas is supplied to the articles stored in the storage sections in both of the first interior space and the second interior space, and
the partial supply control is a supply control in which the inactive gas is supplied to the articles stored in the storage sections in one of the first interior space and the second interior space.

5. The article storage facility according to claim 4, wherein:
a door state detection device that detects an open/closed state of the first door and the second door is provided, and
the supply control device is configured to, based on detection information from the door state detection device, allow supply of the inactive gas to the articles stored in the storage sections in both of the first interior space and the second interior space when the first door and the second door are in the closed state; and stop supply of the inactive gas to the articles stored in the storage sections in both of the first interior space and the second interior space when the first door is operated to open from the closed state or when the second door is operated to open from the closed state.

6. An article storage facility comprising:
an article storage rack including a plurality of storage sections that store articles;
an article transport device that moves in front of the article storage rack, along a lateral width direction of the rack to transport the articles; and
a transport control device that controls operation of the article transport device, wherein:

a movement path in which the article transport device moves includes a first path portion and a second path portion that are arranged side by side in the lateral width direction of the rack, a plurality of transport controls selectively performed by the transport control device include a full path transport control and a partial path transport control, the full path transport control is a transport control in which the article transport device is moved in both the first path portion and the second path portion to transport the articles, the partial path transport control is a transport control in which the article transport device is moved in one of the first path portion and the second path portion to transport the articles, a partition body is provided that is switchable between an installed state in which the partition body is installed in a path boundary area serving as a boundary area between the first path portion and the second path portion in the movement path to shut off communication between the first path portion and the second path portion, and a retracted state in which the partition body is retracted from the path boundary area to open the path boundary area, and further comprising a surrounding body that surrounds a space including both an installation space in which the article storage rack is installed and the movement path, when viewed in plan view, wherein:

the surrounding body is provided with a first entrance from which an operator enters and exits the first path portion, a first door that opens and closes the first entrance, a second entrance from which the operator enters and exits the second path portion, and a second door that opens and closes the second entrance, a partition state detection device that detects a state of installation of the partition body and a door state detection device that detects an open/closed state of the first door and the second door are provided, and the transport control device is configured to, based on detection information from each of the partition state detection device and the door state detection device, allow movement of the article transport device in the full path transport control when both of the first door and the second door are in a closed state and the partition body is in the retracted state; and inhibit movement of the article transport device in the full path transport control when at least one of the first door and the second door is not in the closed state or when the partition body is not in the retracted state.

7. The article storage facility according to claim 6, further comprising a wall body that covers an interior space including both an installation space in which the article storage rack is installed and the movement path, and wherein:

the wall body is provided with an opening from which an operator enters and exits the movement path and an opening/closing door that opens and closes the opening, the interior space includes a first interior space and a second interior space that are arranged side by side in the lateral width direction of the rack, the partition body is installed in the installed state so as to be located in a boundary area between the first interior space and the second interior space to divide the interior space into the first interior space and the second interior space, the opening is formed so as to extend across the path boundary area toward both the first interior space and the second interior space in the lateral width direction of the rack, and is also formed by a first opening portion, a second opening portion, and a third opening portion, the first opening portion is formed at a position at which the entire opening region thereof overlaps the first interior space when viewed in a front-rear direction of the rack, the second opening portion is formed at a position at which the entire opening region thereof overlaps the second interior space when viewed in the front-rear direction of the rack, the third opening portion is formed so as to be located between the first opening portion and the second opening portion in the lateral width direction of the rack, and to include an opening region that overlaps the first interior space when viewed in the front-rear direction of the rack and an opening region that overlaps the second interior space when viewed in the front-rear direction of the rack, the first opening portion and the third opening portion form a first entrance from which the operator enters and exits the first path portion, the second opening portion and the third opening portion form a second entrance from which the operator enters and exits the second path portion, and the opening/closing door is configured to be extensible and contractible along the lateral width direction of the rack so as to be switchable between a closed state in which the opening/closing door is extended in the lateral width direction of the rack to close the entire opening, a first open state in which the opening/closing door is contracted in the lateral width direction of the rack to close only the second opening portion and open the first entrance in the opening, and a second open state in which the opening/closing door is contracted in the lateral width direction of the rack to close only the first opening portion and open the second entrance in the opening.

8. The article storage facility according to claim 7, wherein:

the partition body is configured to be movable in the installed state between a first partition position at which an end of the partition body that is located toward the opening in the front-rear direction of the rack is located in a boundary area between the second opening portion and the third opening portion in the opening, and a second partition position at which the end is located in a boundary area between the first opening portion and the third opening portion in the opening, and an operative connection mechanism is provided that operatively connects the partition body with the opening/closing door such that the partition body moves to the first partition position as the opening/closing door is switched to the first open state, and that the partition body moves to the second partition position as the opening/closing door is switched to the second open state.

9. An article storage facility comprising:

an article storage rack including a plurality of storage sections that store articles;

an article transport device that moves in front of the article storage rack, along a lateral width direction of the rack to transport the articles; and a transport control device that controls operation of the article transport device, wherein:

a movement path in which the article transport device moves includes a first path portion and a second path portion that are arranged side by side in the lateral width direction of the rack, a plurality of transport controls selectively performed by the transport control device include a full path transport control and a partial path transport control, the full path transport control is a transport control in which the article transport device is moved in both the first path portion and the second path portion to transport the articles, the partial path transport control is a transport control in which the article transport device is moved in one of the first path portion and the second path portion to transport the articles, a partition body is provided that is switchable between an installed state in which the partition body is installed in a path boundary area serving as a boundary area between the first path portion and the second path portion in the movement path to shut off communication between the first path portion and the second path portion, and a retracted state in which the partition body is retracted from the path boundary area to open the path boundary area, and further comprising:

a wall body that covers an interior space including both an installation space in which the article storage rack is installed and the movement path;

an inactive gas supply device that supplies an inactive gas to the articles stored in the storage sections; and a supply control device that controls operation of the inactive gas supply device, wherein:

the wall body is provided with a first entrance from which an operator enters and exits the first path portion, a first door that opens and closes the first entrance, a second entrance from which the operator enters and exits the second path portion, and a second door that opens and closes the second entrance, the interior space includes a first interior space and a second interior space that are arranged side by side in the lateral width direction of the rack, the partition body is installed in the installed state so as to be located in a boundary area between the first interior space and the second interior space to divide the interior space into the first interior space and the second interior space, a plurality of supply controls selectively performed by the supply control device include a full supply control and a partial supply control, the full supply control is a supply control in which the inactive gas is supplied to the articles stored in the storage sections in both of the first interior space and the second interior space, and the partial supply control is a supply control in which the inactive gas is supplied to the articles stored in the storage sections in one of the first interior space and the second interior space.

10. The article storage facility according to claim 9, wherein:

a door state detection device that detects an open/closed state of the first door and the second door is provided, and the supply control device is configured to, based on detection information from the door state detection device, allow supply of the inactive gas to the articles stored in the storage sections in both of the first interior space and the second interior space when the first door and the second door are in the closed state and stop supply of the inactive gas to the articles stored in the storage sections in both of the first interior space and the second interior space when the first door is operated to open from the closed state or when the second door is operated to open from the closed state.

* * * * *

UNITED STATES PATENT AND TRADEMARK OFFICE
CERTIFICATE OF CORRECTION

PATENT NO. : 10,160,597 B2
APPLICATION NO. : 14/987958
DATED : December 25, 2018
INVENTOR(S) : Toshihito Ueda et al.

It is certified that error appears in the above-identified patent and that said Letters Patent is hereby corrected as shown below:

In the Claims

Column 27, Line 50, Claim 1, after "device," delete "and"

Column 34, Line 31, Claim 10, delete "state" and insert -- state, --

Signed and Sealed this
Twenty-eighth Day of May, 2019

Andrei Iancu
*Director of the United States Patent and Trademark Office*